United States Patent
Notani

(10) Patent No.: US 7,345,936 B2
(45) Date of Patent: Mar. 18, 2008

(54) DATA STORAGE CIRCUIT

(75) Inventor: Hiromi Notani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 285 days.

(21) Appl. No.: 10/739,090

(22) Filed: Dec. 19, 2003

(65) Prior Publication Data

US 2004/0243758 A1 Dec. 2, 2004

(30) Foreign Application Priority Data

May 30, 2003 (JP) ............... 2003-154519

(51) Int. Cl.
*G11C 7/00* (2006.01)
(52) U.S. Cl. .................. 365/203; 365/230.01
(58) Field of Classification Search ........... 365/203, 365/230.01
See application file for complete search history.

(56) References Cited

U.S. PATENT DOCUMENTS

| 5,896,328 | A | * | 4/1999 | Tanizaki et al. ............ 365/200 |
| 5,970,006 | A | * | 10/1999 | Numata et al. ............. 365/203 |
| 6,198,680 | B1 | | 3/2001 | Sugamoto et al. |
| 6,324,109 | B1 | * | 11/2001 | Inoue .......................... 365/203 |
| 6,430,073 | B1 | * | 8/2002 | Batson et al. ................. 365/49 |
| 6,781,857 | B1 | * | 8/2004 | Lien et al. ..................... 365/49 |
| 2001/0026464 | A1 | * | 10/2001 | Hata et al. ..................... 365/49 |
| 2002/0039316 | A1 | * | 4/2002 | Tobita .......................... 365/222 |
| 2002/0067632 | A1 | * | 6/2002 | Batson et al. ................. 365/49 |
| 2002/0181274 | A1 | * | 12/2002 | Nii .............................. 365/154 |
| 2004/0037108 | A1 | * | 2/2004 | Notani ......................... 365/154 |

FOREIGN PATENT DOCUMENTS

| JP | 9-185886 | 7/1997 |
| JP | 2000-231791 | 8/2000 |
| JP | 2001-184868 | 7/2001 |
| JP | 2001-344979 | 12/2001 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A data storage circuit having a plurality of memory cells (S1), a plurality of bit lines (BL, /BL) and a precharge circuit further comprises a discharge circuit. In an operating mode of the data storage circuit, the bit lines (BL, /BL) are precharged by the precharge circuit under the control on the basis of a chip enable signal (CE) before write or read of data into/from the memory cells (S1) and in a standby state, the bit lines (BL, /BL) are discharged by the discharge circuit. Further, also in a sleep mode, the bit lines (BL, /BL) are discharged by the discharge circuit. With this circuit configuration and operation, it is possible to provide the data storage circuit which allows reduction in standby power consumption by suppressing standby currents in the standby state.

7 Claims, 18 Drawing Sheets

F I G. 6
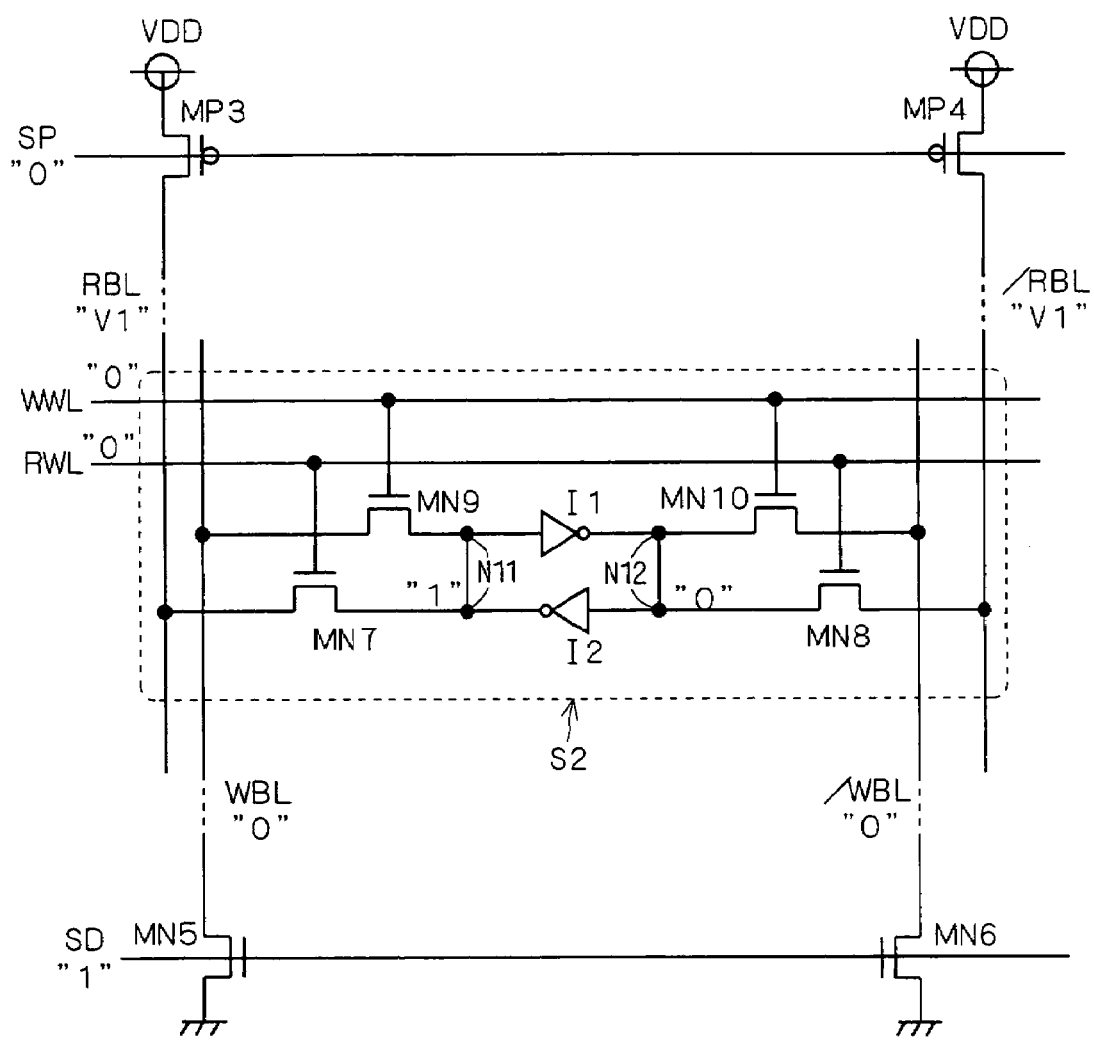

F I G . 9
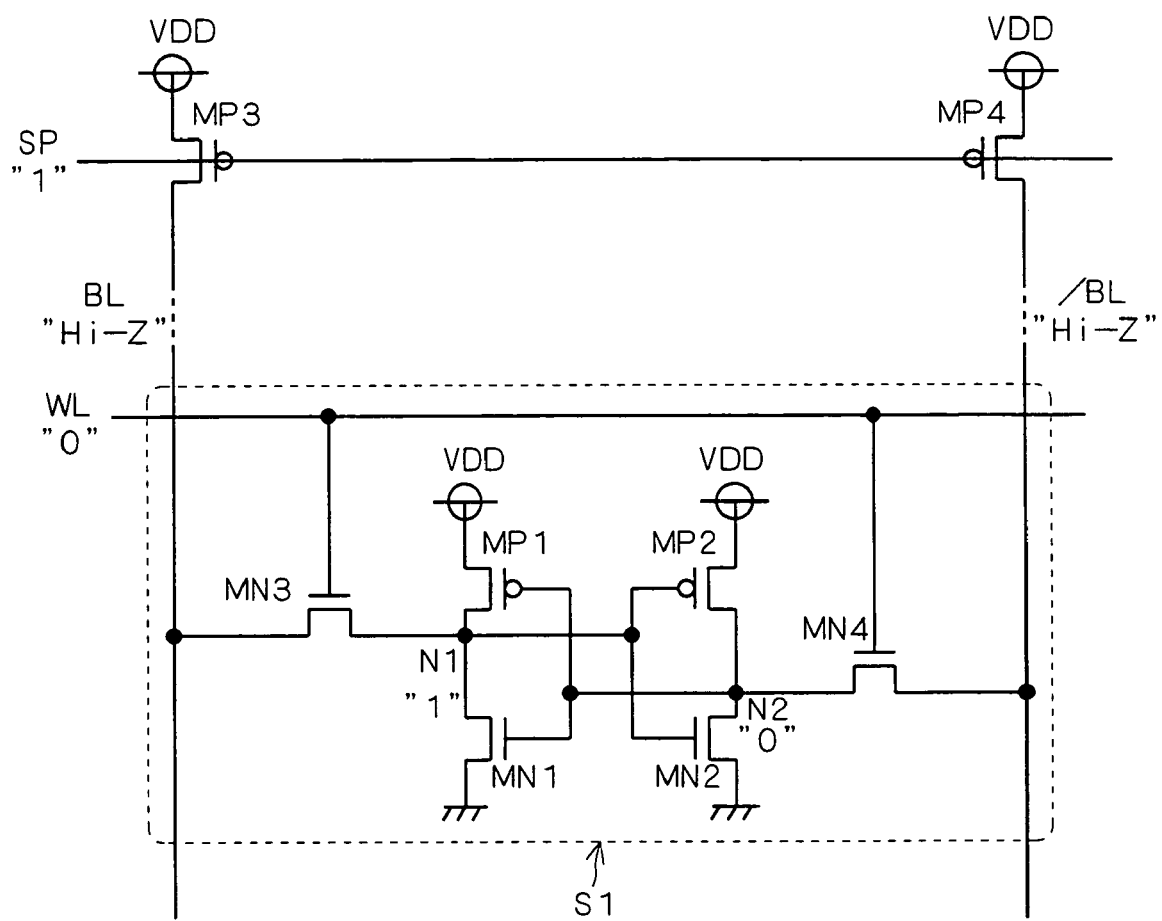

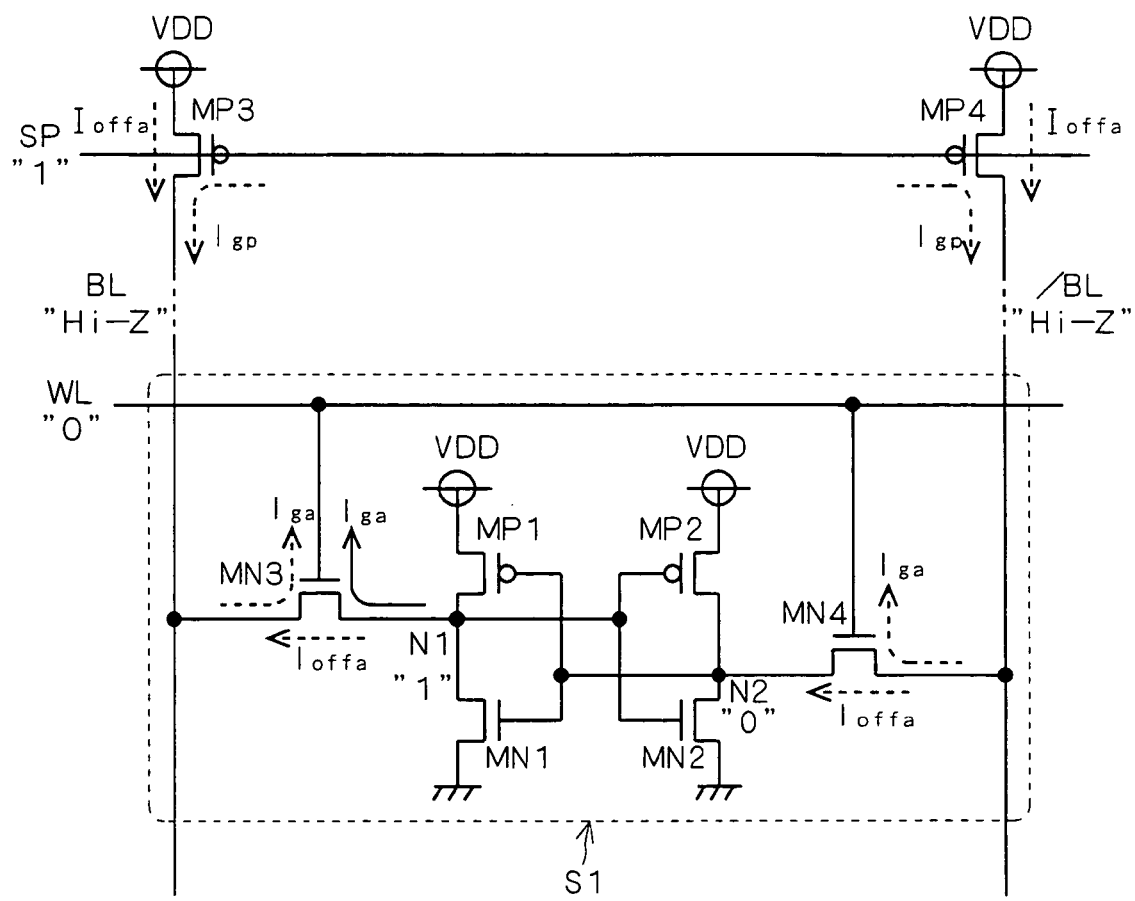
F I G. 13

DATA STORAGE CIRCUIT

BACKGROUND OF THE INVENTION

1. Field of the Invention

The present invention relates to a data storage circuit, and more particularly to potential setting of bit lines or match lines.

2. Description of the Background Art

In a static random access memory (SRAM) of the background art, when data is written into the SRAM or read out from the SRAM, bit lines are first precharged.

Usually, precharge of the bit lines is performed during a period while a clock signal indicates "0" level and write or read of data is performed during a period while the clock signal indicates "1" level (see Japanese Patent Application Laid-Open No. 2001-344979, Paragraph No. 0063, FIG. 1 and the like).

Recently, however, with thinning of gate oxide films in size reduction of devices, in the background-art technique where the precharge of the bit lines is performed in a standby state of the SRAM (during the period while no access is made to the SRAM), a gate leak current flowing in a gate oxide film or the like (understood as a standby current) in the standby state tends to increase and a standby power consumption of the SRAM disadvantageously increases as the standby current increases.

SUMMARY OF THE INVENTION

It is an object of the present invention to provide a data storage circuit capable of suppressing standby currents in the standby state of a memory cell and reducing standby power consumption.

The present invention is intended for a data storage circuit having a plurality of memory cells for storing data and a plurality of bit lines for transmitting the data and having an operating mode and a sleep mode on the basis of a mode signal. According to a first aspect of the present invention, the data storage circuit includes a precharge circuit and a potential setting circuit. The precharge circuit precharges the bit lines with a first potential. The potential setting circuit sets the bit lines to a second potential which is lower than the first potential. In the data storage circuit of the first aspect, the precharge circuit precharges the bit lines to have the first potential before write or read of data into/from the memory cells when a chip enable signal indicates "enable" in the operating mode, and the potential setting circuit sets the bit lines to the second potential in the operating mode with the chip enable signal indicating "disable" and in the sleep mode.

The standby power consumption of the data storage circuit in the standby state can be reduced. Further, when the bit lines are set to the second potential before the write or read of data into/from the memory cells, a PMOS is needed as a drive transistor for the memory cells. Since a PMOS has smaller current driving capability than an NMOS, however, there arises a problem that the access time becomes longer. If the size of the PMOS is made larger in order to maintain the access time, the area of the memory cell becomes larger and the whole area of the data storage circuit disadvantageously increases. Then, by precharging the bit lines in the operation and setting the bit lines to the second potential in the standby state, an NMOS transistor can be adopted as the drive transistor and therefore it is possible to reduce the standby power consumption and maintain the operation speed of the data storage circuit.

The present invention is intended for a data storage circuit having a plurality of multiport memory cells for storing data, a plurality of read bit lines for transmitting the data and a plurality of write bit lines. According to a second aspect of the present invention, the data storage circuit includes a precharge circuit and a potential setting circuit. The precharge circuit precharges the read bit lines with a first potential under control on the basis of a clock signal. The potential setting circuit sets the write bit lines to a second potential which is lower than the first potential under control on the basis of the clock signal.

It is possible to reduce the standby power consumption of the data storage circuit including the multiport memory cells with a simple circuit design.

The present invention is intended for a data storage circuit having a plurality of memory cell blocks each including a plurality of memory cells for storing data and a plurality of bit lines for transmitting the data. According to a third aspect of the present invention, the data storage circuit includes a precharge circuit and a potential setting circuit. The precharge circuit precharges the bit lines with a first potential. The potential setting circuit sets the bit lines to a second potential which is lower than the first potential. In the data storage circuit of the third aspect, the precharge circuit precharges some of the bit lines which are connected to one of the memory cell blocks which is specified by an address signal with the first potential before write or read of data into/from the memory cells and the potential setting circuit sets the others of the bit lines which are connected to the memory cell blocks which are not specified by the address signal to the second potential.

It is possible to perform control which is more exacting than the control using the chip enable signal and reduce leakage currents generated in the memory cells. Therefore, a data storage circuit with low power consumption can be provided.

The present invention is intended for a data storage circuit having a plurality of content addressable memory cells in which matching of stored data is performed with a searching signal and a plurality of match lines to which a result of the matching is outputted. According to a fourth aspect of the present invention, the data storage circuit includes a precharge circuit and a potential setting circuit. The precharge circuit precharges the match lines with a first potential. The potential setting circuit sets a potential of the match lines to a second potential which is lower than the first potential. In the data storage circuit of the fourth aspect, the precharge circuit precharges the match lines with the first potential before the matching of data stored in the content addressable memory cells when the searching signal indicates "enable" and the potential setting circuit sets the match lines to the second potential when the searching signal indicates "disable".

It is possible to reduce leakage currents generated between a pull-down transistor and a match line constituting a content addressable memory in a state where no searching operation is performed in the operating mode and ensure reduction in power consumption of the data storage circuit.

The present invention is intended for a data storage circuit having a plurality of memory cells for storing data and a plurality of bit lines for transmitting the data and having an operating mode and a sleep mode on the basis of a mode signal. According to a fifth aspect of the present invention, the data storage circuit includes a precharge circuit. The precharge circuit precharges the bit lines with a predetermined potential. In the data storage circuit of the fifth aspect, the precharge circuit precharges the bit lines to have the predetermined potential before write or read of data into/from the memory cells when a chip enable signal indicates "enable" in the operating mode and precharge of the bit lines by the precharge circuit is stopped and the bit lines are brought into a floating state in the operating mode with the chip enable signal indicating "disable" and in the sleep mode.

It is possible to reduce the standby power consumption of the data storage circuit with a simple circuit design. Further, since whether the bit lines should be precharged or brought into the floating state is controlled in accordance with the change in the standby state when the memory cell is accessed, it is possible to reduce the standby power consumption of the data storage circuit with the more exacting control.

The present invention is intended for a data storage circuit having a plurality of memory cell blocks each including a plurality of memory cells for storing data and a plurality of bit lines for transmitting the data. According to a sixth aspect of the present invention, the data storage circuit includes a precharge circuit. The precharge circuit precharges the bit lines with a first potential. In the data storage circuit of the sixth aspect, the precharge circuit precharges some of the bit lines which are connected to one of the memory cell blocks which is specified by an address signal with the first potential before write or read of data into/from the memory cells and the others of the bit lines which are connected to the memory cell blocks which are not specified by the address signal are not precharged by the precharge circuit but brought into a floating state.

Since the data storage circuit of the sixth aspect does not have such a potential, setting circuit as included in the data storage circuit of the third aspect, the standby power consumption of the data storage circuit of the sixth aspect can be reduced with a simple circuit design. Further, it is possible to perform control which is more exacting than the control using the chip enable signal.

The present invention is intended for a data storage circuit having a plurality of content addressable memory cells in which matching of stored data is performed with a searching signal and a plurality of match lines to which a result of the matching is outputted. According to a seventh aspect of the present invention, the data storage circuit includes a precharge circuit. The precharge circuit precharges the match lines with a first potential. In the data storage circuit of the seventh aspect, the precharge circuit precharges the match lines to have the first potential before the matching of data stored in the content addressable memory cells when the searching signal indicates "enable" and precharge of the match lines by the precharge circuit is stopped and the match lines are brought into a floating state when the searching signal indicates "disable".

Since the data storage circuit of the seventh aspect does not have such a potential setting circuit as included in the data storage circuit of the fourth aspect, the standby power consumption of the data storage circuit of the seventh aspect can be reduced with a simple circuit design.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram showing a configuration of a data storage circuit in accordance with a second preferred embodiment;

FIG. 9 is a circuit diagram showing a configuration of a data storage circuit in accordance with a third preferred embodiment;

FIG. 13 is a circuit diagram showing leakage currents in a standby state of the data storage circuit in accordance with the third preferred embodiment;

DESCRIPTION OF THE PREFERRED EMBODIMENTS

The present invention will be specifically discussed below, referring to figures showing the preferred embodiments.

The First Preferred Embodiment

Figure 1:
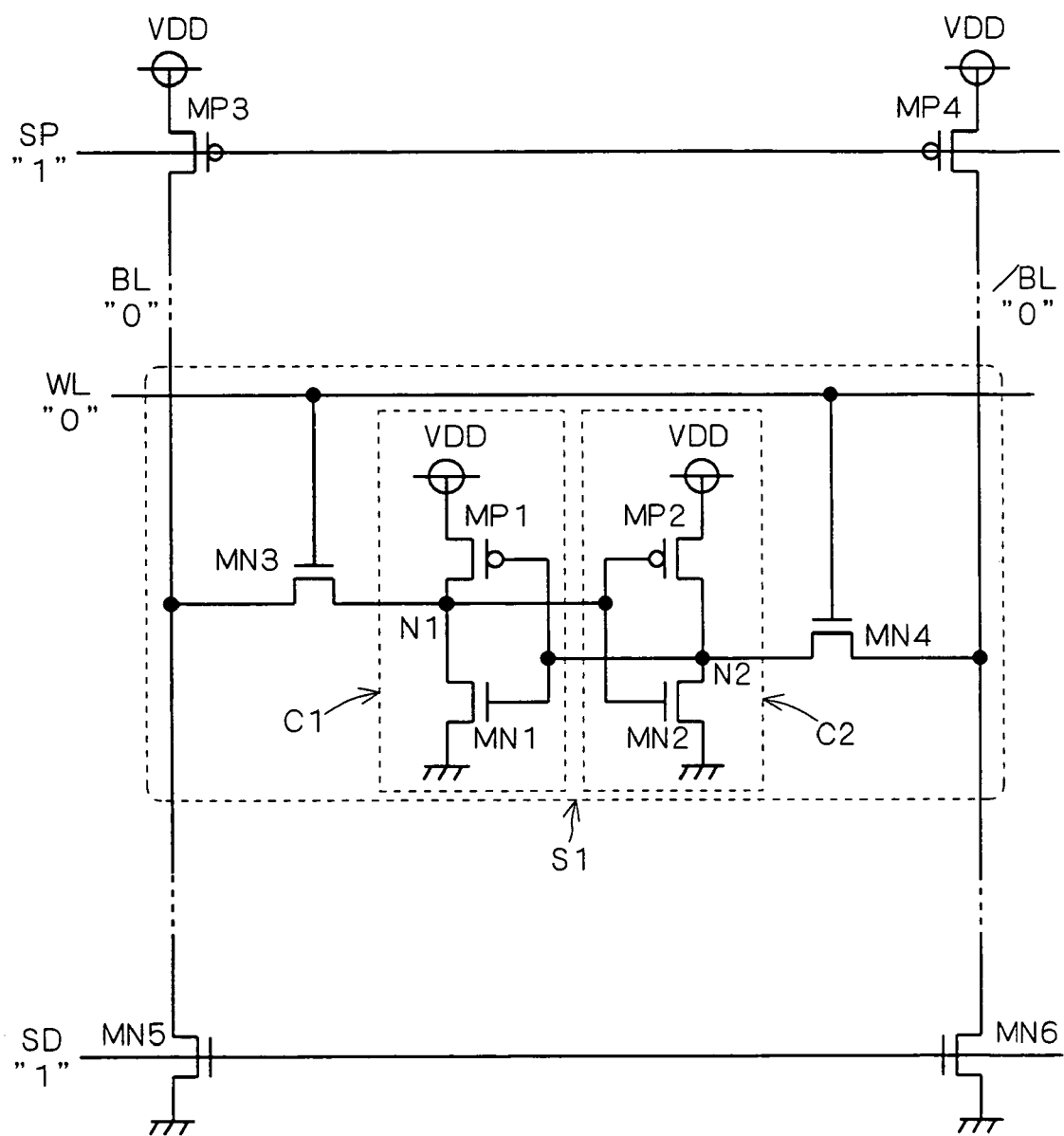
FIG. 1 is a circuit diagram showing a configuration of a data storage circuit in accordance with a first preferred embodiment.

FIG. 1 shows a configuration of a data storage circuit in accordance with the first preferred embodiment.

The data storage circuit of the first preferred embodiment comprises an SRAM cell S1, a precharge circuit for precharging bit lines BL and /BL and a discharge circuit for discharging the bit lines BL and /BL, and the precharge circuit and the discharge circuit are controlled on the basis of a mode signal MD having an operating mode and a sleep mode and a chip enable signal CE.

Though the data storage circuit comprises a plurality of SRAM cells S1 arranged in a matrix and a plurality of word lines WL used for selecting the respective SRAM cells S1 and a plurality of bit lines BL and /BL, FIG. 1 shows only one SRAM cell S1 and its relevant peripheral circuit in close-up.

Specific discussion will be made below on a configuration of the data storage circuit of the first preferred embodiment, referring to FIG. 1.

<Circuit Configuration>

First, the SRAM cell S1 consists of two CMOS inverters C1 and C2 whose input portions and output portions are connected to each other and two N-type access transistors MN3 and MN4.

Specifically, the CMOS inverter C1 consists of a P-type load transistor MP1 whose source is connected to a fixed power supply VDD and an N-type drive transistor MN1 whose source is grounded, which are connected in series to each other. On the other hand, the CMOS inverter C2 consists of a P-type load transistor MP2 whose source is connected to the fixed power supply VDD and an N-type drive transistor MN2 whose source is grounded, which are connected in series to each other. Herein, the potential of the fixed power supply VDD is V1.

A data holding node N1 on the side of the CMOS inverter C1 is connected to the bit line BL through the N-type access transistor MN3 and on the other hand, a data holding node N2 on the side of the CMOS inverter C2 is connected to the bit line /BL through the N-type access transistor MN4.

The word line WL is connected in common to respective gates of the access transistors MN3 and MN4.

The above is the circuit configuration of the SRAM cell S1.

Next, discussion will be made on configurations of the precharge circuit and the discharge circuit.

The precharge circuit consists of P-type precharge transistors MP3 and MP4 and the fixed power supply VDD whose potential is V1. Specifically, one end of the bit line BL is connected to the fixed power supply VDD through the precharge transistor MP3 and on the other hand, one end of the bit line /BL is connected to the fixed power supply VDD through the precharge transistor MP4.

In this configuration, a precharge signal SP is inputted to respective gates of the precharge transistors MP3 and MP4, which controls precharge of the bit lines BL and /BL.

On the other hand, the discharge circuit consists of N-type discharge transistors MN5 and MN6 whose one ends are grounded. Specifically, the other end of the bit line BL is grounded through the discharge transistor MN5 and the other end of the bit line /BL is grounded through the discharge transistor MN6.

In this configuration, a discharge signal SD is inputted to respective gates of the discharge transistors MN5 and MN6, which controls discharge of the bit lines BL and /BL.

The above is the circuit configurations of the precharge circuit and the discharge circuit.

Next, specific discussion will be made on an operation of the data storage circuit in accordance with the first preferred embodiment shown in FIG. 1, referring to the timing chart of FIG. 2. The data storage circuit has an operating mode and a sleep mode on the basis of the mode signal MD.

Figure 2:
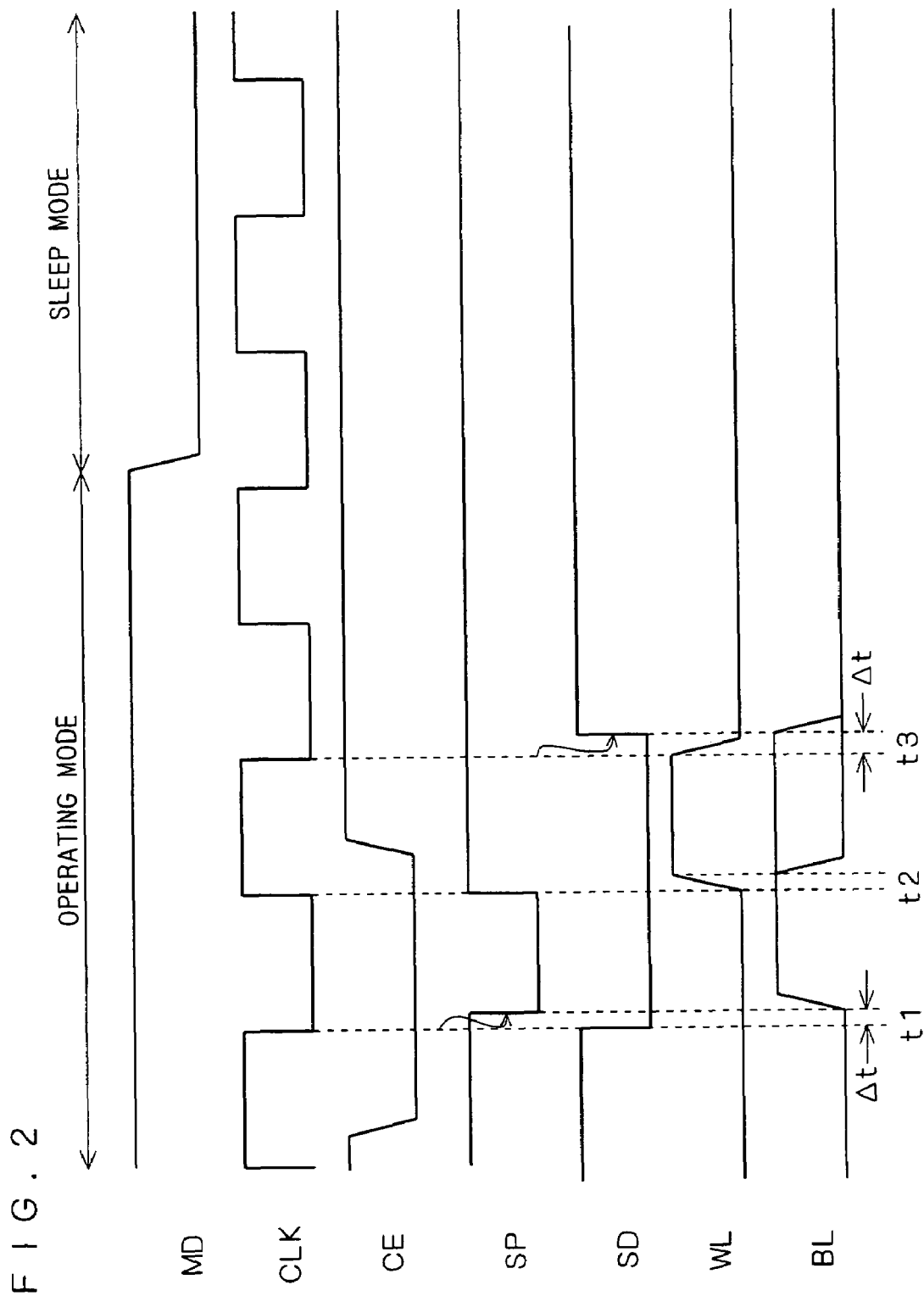
FIG. 2 is a timing chart showing an operation timing of the data storage circuit in accordance with the first preferred embodiment.

Specifically, as shown in FIG. 2, when the mode signal MD indicates "1", the data storage circuit comes into the operating mode and when the mode signal MD indicates "0", the data storage circuit comes into the sleep mode. The operating mode refers to a period while access is made to the SRAM cell S1 and the sleep mode refers to a period while the circuit is in a state of low power consumption to which the circuit is automatically switched under the condition that no access is made to the SRAM cell S1 for a certain period or the like.

<Circuit Operation>

First, discussion will be made on a case where the data storage circuit is in the operating mode.

The discharge signal SD and the precharge signal SP are controlled on the basis of the chip enable signal CE.

Specifically, when no access is made to the SRAM cell S1, in other words, when the chip enable signal CE indicates "disable" ("1" level in FIG. 2) (in a standby state), the discharge signal SD is controlled to come into "1" level following the first fall of a clock signal CLK (at time t3 of FIG. 2) after the change of the chip enable signal CE into the "1" level.

After that, as shown in FIG. 2, the discharge signal SD may keep the "1" level during the period while the chip enable signal CE indicates the "1" level, and further the discharge signal SD may be controlled to come into the "1" level only during a period while the clock signal CLK indicates "0" level while the chip enable signal CE indicates the "1" level, though not shown.

Therefore, when the "1" level is inputted as the discharge signal SD, both the discharge transistors MN5 and MN6 come into an ON state and the bit lines BL and /BL are discharged to the ground potential. At this time, the precharge signal SP indicates "1" level, and the precharge transistors MP3 and MP4 are in an OFF state.

In the standby state of the data storage circuit, the word line WL is fixed to "0" level.

On the other hand, when the SRAM cell S1 is accessed, in other words, when the chip enable signal CE indicates "enable" ("0" level in FIG. 2), the precharge signal SP is controlled to come into "0" level following the first fall of the clock signal CLK (i.e., the fall of the clock signal CLK at time t1 of FIG. 2) after the change of the chip enable signal CE into the "0" level. The precharge signal SP is controlled to be "0" level for a predetermined period while the clock signal CLK is in the "0" level (a period until time t2 in FIG. 2).

The discharge signal SD is controlled to come into "0" level in synchronization with the first fall of the clock signal CLK (i.e., the fall of the clock signal CLK at time t1 of FIG. 2) after the change of the chip enable signal CE into the "0" level.

When the "0" level is inputted as the precharge signal SP, with the above operation, both the precharge transistors MP3 and MP4 come into the ON state and the bit lines BL and /BL are precharged by the fixed power supply VDD to have the potential V1. During a period while the "0" level is inputted as the discharge signal SD, the discharge transistors MN5 and MN6 are in the OFF state.

Next, when the precharge signal SP changes into "1" level in synchronization with the rise of the clock signal CLK at time t2, the precharge signal SP is controlled to keep in the "1" level and the discharge signal SD is controlled to keep in the "0" level until time t3, and on the other hand, a predetermined word line WL is selected.

This brings the transistors MP3, MP4, MN5 and MN6 into the OFF state and a normal operation of write/read of data is performed at predetermined bit lines BL and /BL.

Therefore, in the operating mode of the data storage circuit of the first preferred embodiment, the bit lines BL and /BL are precharged to have the potential V1 for a predetermined period immediately before the write/read operation of data into/from the SRAM cell S1 and the bit lines BL and /BL are discharged to have the ground potential (0V) in the standby state of the SRAM cell S1.

Next, discussion will be made on a case where the data storage circuit is in the sleep mode.

When the data storage circuit is in the sleep mode, as shown in FIG. 2, both the precharge signal SP and the discharge signal SD are brought into "1" level. This brings the discharge transistors MN5 and MN6 into the ON state and the precharge transistors MP3 and MP4 into the OFF state.

Therefore, in the sleep mode of the data storage circuit, the bit lines BL and /BL are discharged by the discharge circuit, to have the ground potential.

The above is the operation of the data storage circuit of the first preferred embodiment.

Figure 3:
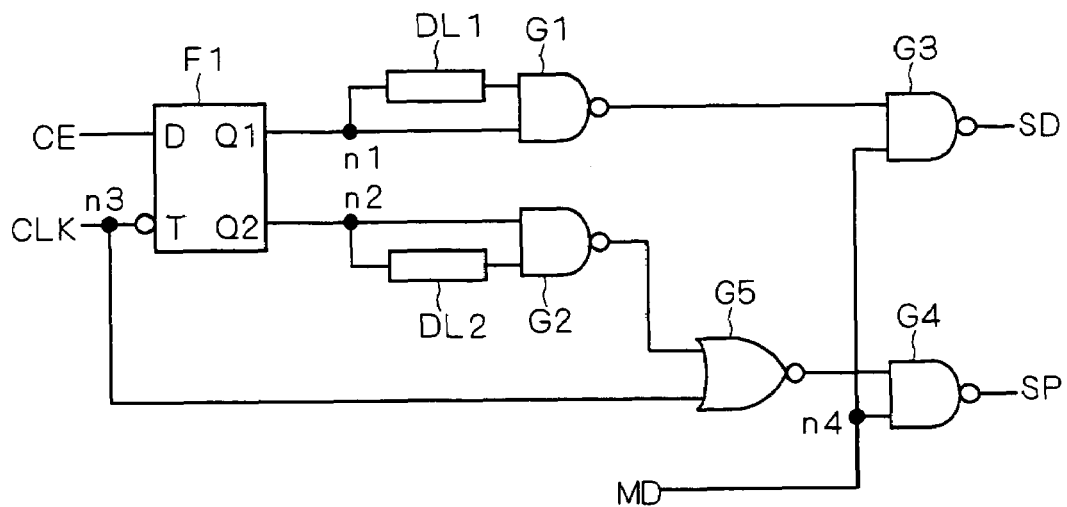
FIG. 3 is a circuit diagram showing a configuration of a signal generation circuit in accordance with the first preferred embodiment.

In order to generate the precharge signal SP and the discharge signal SD in accordance with the timing chart of FIG. 2, for example, a signal generation circuit such as shown in FIG. 3 is needed.

As can be seen from the signal generation circuit of FIG. 3, the precharge signal SP and the discharge signal SD are generated on the basis of the mode signal MD, the chip enable signal CE and the clock signal CLK. Configuration and operation of the signal generation circuit will be discussed below.

<Configuration of Signal Generation Circuit>

As can be seen from FIG. 3, the signal generation circuit consists of a flip-flop circuit F1, two delay circuits DL1 and DL2, four NAND gates G1 to G4 and a NOR gate G5. The delay circuits DL1 and DL2 each consist of a plurality of inverters which are connected in series to one another and have a delay time of ? t, for example.

The chip enable signal CE is inputted to a D terminal of the flip-flop circuit F1 and an inverted clock signal CLK is inputted to a T terminal of the flip-flop circuit F1.

Further, a Q1 terminal of the flip-flop circuit F1 is connected to one input portion of the NAND gate G1 through a node n1 and on the other hand to an input portion of the delay circuit DL1. An output portion of the delay circuit DL1 is connected to the other input portion of the NAND gate G1.

A Q2 terminal of the flip-flop circuit F1 (from the Q2 terminal outputted is an inverted signal of an output from the Q1 terminal) is connected to one input portion of the NAND gate G2 through a node n2 and on the other hand to an input portion of the delay circuit DL2. An output portion of the delay circuit DL2 is connected to the other input portion of the NAND gate G2.

An output portion of the NAND gate G2 is connected to one input portion of the NOR gate G5 and the clock signal CLK which is branched at a node n3 is inputted to the other input portion of the NOR gate G5.

An output portion of the NAND gate G1 is connected to one input portion of the NAND gate G3 and an output portion of the NOR gate G5 is connected to one input portion of the NAND gate G4. The mode signal MD which is branched at a node n4 is inputted to the other input portion of the NAND gate G3 and the other input portion of the NAND gate G4.

<Operation of Signal Generation Circuit>

Next, discussion will be made on an operation of the signal generation circuit which has the configuration shown in FIG. 3. It is assumed herein that the flip-flop circuit F1 captures the chip enable signal CE at the timing of fall of the clock signal CLK.

Discussion will begin with generation of the discharge signal SD in the operating mode of the data storage circuit.

When the T terminal of the flip-flop circuit F1 receives a fall of the clock signal CLK at time t1, the D terminal of the flip-flop circuit F1 captures the chip enable signal CE of "0" level and a signal of "0" level is outputted from the Q1 terminal of the flip-flop circuit F1.

Then, the Q1 terminal of the flip-flop circuit F1 holds the signal of "0" level until a next fall of the clock signal CLK is inputted (till time t3) and continues to output the signal of "0" level during a period of $t1 \leq T1 < t3$.

Therefore, since the signal of "0" level continues to be inputted to one input portion of the NAND gate G1 during the period T1, the output portion of the NAND gate G1 continues to output a signal of "1" level.

Accordingly, during the period T1, since the mode signal MD indicates "1" level and the signal outputted from the output portion of the NAND gate G1 indicates "1" level, the output portion of the NAND gate G3 continues to output the discharge signal SD of "0" level.

Then, at time t3, since a next fall of the clock signal CLK is inputted to the T terminal of the flip-flop circuit F1, the D terminal of the flip-flop circuit F1 captures the chip enable signal CE of "1" level and the Q1 terminal of the flip-flop circuit F1 begins to output a signal of "1" level.

During a period of $t3 \leq T2 < t3 + \Delta t$, however, since the output portion of the delay circuit DL1 having the delay time $\Delta t$ continues to output a signal of "0" level, the output portion of the NAND gate G1 continues to output a signal of "1" level.

Therefore, also at the period T2, the output portion of the NAND gate G3 outputs the discharge signal SD of "0" level.

After the time $t3+\Delta t$, however, since the output portion of the delay circuit DL1 begins to output a signal of "1" level, the signal of "1" level is inputted to both the input portions of the NAND gate G1 and as a result, the signal outputted from the output portion of the NAND gate G1 changes into "0" level.

Therefore, after the time $t3+\Delta t$, since the signal of "0" level is inputted to one input portion of the NAND gate G3 and the mode signal MD of "1" level is inputted to the other input portion thereof, the output portion of the NAND gate G3 begins to output the discharge signal SD of "1" level.

Further, in the sleep mode of the data storage circuit, since the ms MD comes into "0" level and the mode signal MD of "0" level is inputted to the other input portion of the NAND gate G3, the output portion of the NAND gate G3 outputs the discharge signal SD of "1" level.

Next, discussion will be made on generation of the precharge signal SP in the operating mode of the data storage circuit.

As discussed above, when the T terminal of the flip-flop circuit F1 receives a fall of the clock signal CLK at time t1, since the D terminal of the flip-flop circuit F1 captures the chip enable signal CE of "0" level, the Q2 terminal of the flip-flop circuit F1 outputs a signal of "1" level (an inverted signal of the output from the Q1 terminal).

Therefore, at time t1+Δt, the signal of "1" level comes to be outputted also from the output portion of the delay circuit DL2 having the delay time Δt.

Accordingly, since the signal of "1" level is inputted to both the input portions of the NAND gate G2 from the time t1+Δt, the output portion of the NAND gate G2 outputs a signal of "0" level. Then, the signal of "0" level outputted from the output portion of the NAND gate G2 is inputted to one input portion of the NOR gate G5.

During a period from time t1+Δt to time t2 (a period until the clock signal CLK rises next), the clock signal CLK of "0" level is inputted to the other input portion of the NOR gate G5.

Therefore, during a period from time t1+Δt to time t2, the output portion of the NOR gate G5 outputs a signal of "1" level.

Accordingly, during a period from time t1+Δt to time t2, since the signal of "1" level is inputted to one input portion of the NAND gate G4 and the mode signal MD of "1" level is inputted to the other input portion thereof, the output portion of the NAND gate G4 outputs the precharge signal SP of "0" level.

At time t2, however, since the clock signal CLK comes into "1" level and the signal of "1" level is inputted to the other input portion of the NOR gate G5, the output portion of the NOR gate G5 begins to output a signal of "0" level.

Therefore, at time t2, since the signal of "0" level is inputted to the one input portion of the NAND gate G4, the output portion of the NAND gate G4 begins to output the precharge signal SP of "1" level.

Further, in the sleep mode of the data storage circuit, since the mode signal MD comes into "0" level and the mode signal MD of "0" level is inputted to the other input portion of the NAND gate G4, the output portion of the NAND gate G4 outputs the precharge signal SP of "1" level.

Prior to discussion on an effect of the data storage circuit of the first preferred embodiment having the above configuration, discussion will be made herein on generation of a leakage current of the data storage circuit in the background art in which the bit lines BL and /BL are precharged to have the potential V1 of the fixed power supply VDD, for comparison.

Figure 4:
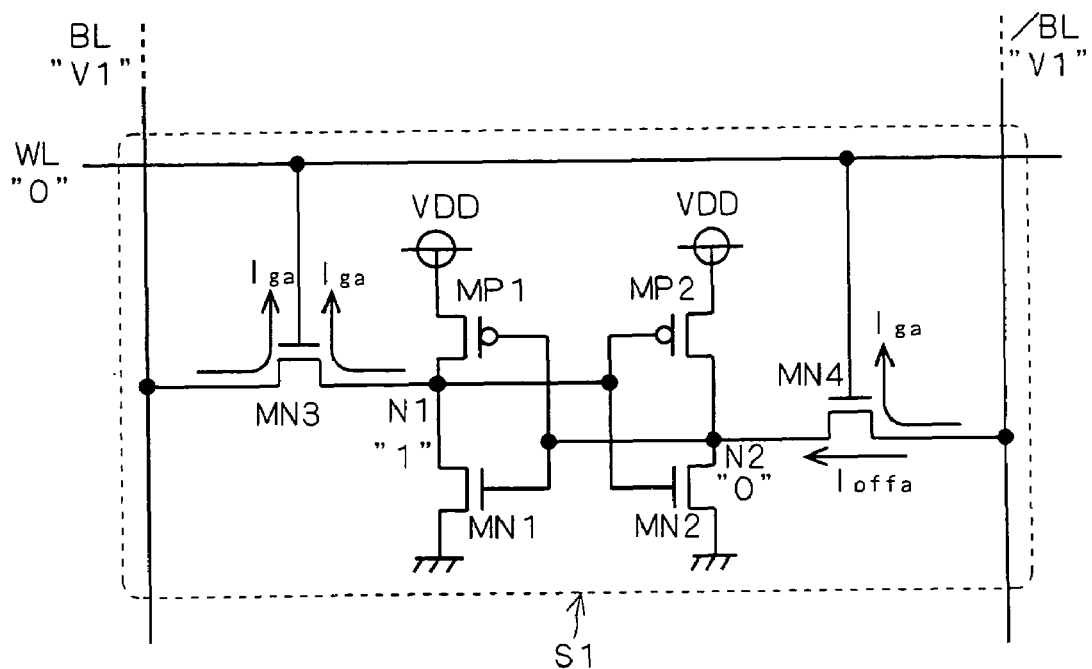
FIG. 4 is a circuit diagram showing leakage currents in a standby state of the data storage circuit in the background art.

In the standby state of the data storage circuit of the background art (where no access is made to the SRAM), leakage currents shown in FIG. 4 are generated in the data storage circuit.

In this case, it is assumed that the data holding node N1 stores "1" level and the data holding node N2 stores "o" level. In the standby state, the word line WL is kept in "0" level.

As can be seen from FIG. 4, a gate leak current Iga flowing from the data holding node N1 towards the word line WL and another gate leak current Iga flowing from the bit line BL towards the word line WL are generated in the access transistor MN3.

Further, a gate leak current Iga flowing from the bit line /BL towards the word line WL and a subthreshold current Ioffa flowing from the bit line /BL towards the data holding node N2 are generated in the access transistor MN4.

Thus, since the bit lines BL and /BL are precharged with the potential V1 in the standby state of the data storage circuit of the background art, four leakage current paths are generated in a unit of memory circuit.

Figure 5:
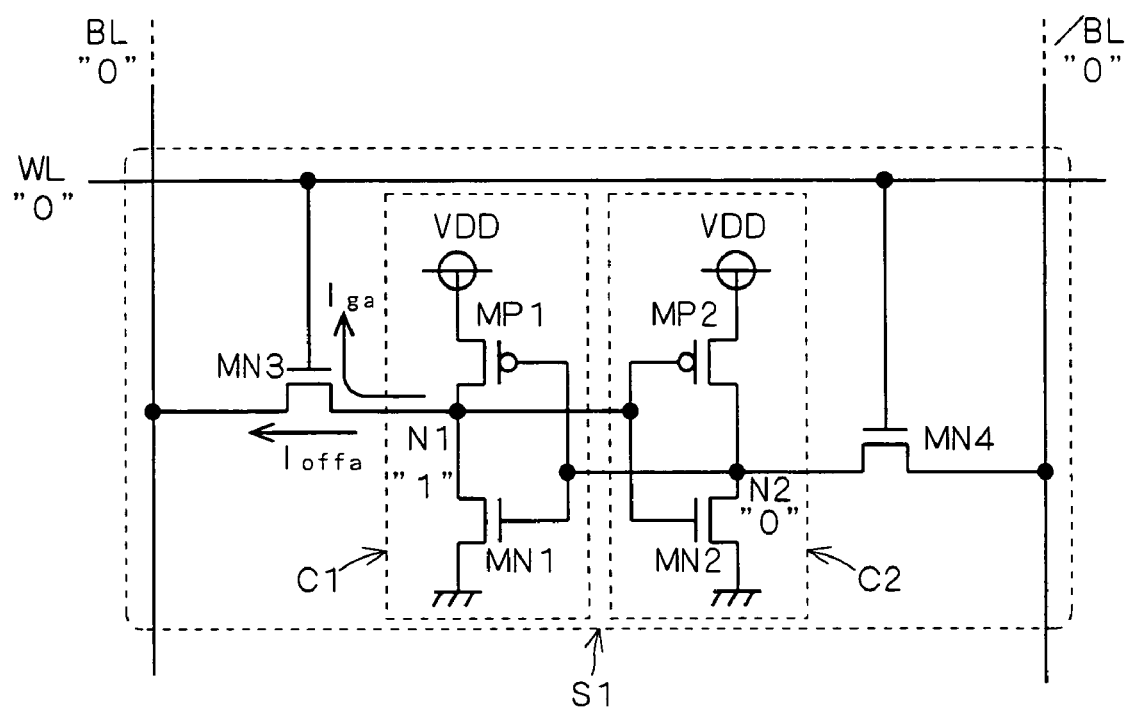
FIG. 5 is a circuit diagram showing leakage currents in a standby state of the data storage circuit in accordance with the first preferred embodiment.

In the data storage circuit of the first preferred embodiment, however, where the bit lines BL and /BL are discharged in the standby state (in the sleep mode and in a state of non-access to the SRAM in the operating mode), only two leakage current paths, i.e., a gate leak current Iga flowing from the data holding node N1 towards a gate of the access transistor MN3 and a subthreshold current Ioffa flowing from the data holding node N1 towards the bit line BL which is discharged to have the ground potential, are generated in the standby state shown in FIG. 5.

In this case, the data holding node N1 stores "1" level and the data holding node N2 stores "0" level. Further, in the standby state, the word line WL is kept in "0" level.

As is clear from the comparison with the background art, by adopting the data storage circuit of the first preferred embodiment (in other words, control of precharge and discharge of the bit lines BL and /BL on the basis of the mode signal MD and the chip enable signal CE), reduction in the number of portions where the leakage currents are generated is achieved, and it is thereby possible to reduce the power consumption of the data storage circuit not only in the sleep mode but also in the state of non-access to the SRAM in the operating mode.

If the bit lines BL and /BL are discharged before the read operation, a PMOS is needed as a drive transistor of the SRAM cell S1. Since a PMOS has smaller current driving capability than an NMOS, however, there arises a problem that the time required to access the SRAM cell S1 becomes longer.

If the size of the PMOS is made larger in order to solve the above problem and maintain the access time, the area of the SRAM cell S1 becomes larger and the whole area of the memory disadvantageously increases.

Then, by discharging the bit lines BL and /BL in the standby state and precharging the bit lines BL and /BL only for a predetermined period before the operation, like in the data storage circuit of the first preferred embodiment, it is possible to solve the above problem without increasing the whole area of the memory cells.

Further, since the precharge and discharge of the bit lines BL and /BL in the operating mode are controlled on the basis of the chip enable signal CE, the control is based on whether the access to the SRAM cell S1 is made or not, and it is therefore possible to perform exacting control on the precharge and discharge.

In the data storage circuit of the first preferred embodiment, also in the sleep mode on the basis of the mode signal MD, the discharge of the bit lines BL and /BL is performed.

Specifically, the precharge circuit and the discharge circuit are controlled on the basis of the mode signal MD which externally notifies whether to operate the SRAM or make it sleep, and in the operating mode, control on the precharge/discharge is performed on the basis of the chip enable signal CE (control may be made to perform precharge during the period while the clock signal indicates "0" level like in the background art) and in the sleep mode, the precharge circuit is turned OFF and the discharge circuit is kept ON.

This can reduce the standby power consumption of the data storage circuit in the sleep mode.

The Second Preferred Embodiment

FIG. 6 shows a configuration of a data storage circuit in accordance with the second preferred embodiment.

The data storage circuit of the second preferred embodiment comprises a 2-port SRAM cell S2, a precharge circuit for precharging read bit lines RBL and /RBL and a discharge circuit for discharging write bit lines WBL and /WBL, and these two circuits are controlled on the basis of the clock signal CLK.

Though the data storage circuit comprises a plurality of 2-port SRAM cells S2 which are arranged in a matrix, a plurality of word lines WWL and RWL used for selecting the respective 2-port SRAM cells S2 and a plurality of bit lines RBL, /RBL, WBL and /WBL, FIG. 6 shows only one 2-port SRAM cell S2 and its relevant peripheral circuit in close-up.

Specific discussion will be made below on a configuration of the data storage circuit of the second preferred embodiment, referring to FIG. 6.

<Circuit Configuration>

First, the 2-port SRAM cell S2 consists of two inverters I1 and I2 whose input portions and output portions are connected to each other and four N-type access transistors MN7 to MN10.

Specifically, a data holding node N11 on an input side of the inverter I1 is connected to the write bit line WBL through the N-type access transistor MN9 and on the other hand, a data holding node N12 on an output side of the inverter I1 is connected to the write bit line /WBL through the N-type access transistor MN10.

The write word line WWL is connected in common to respective gates of the access transistors MN9 and MN10.

Another data holding node N11 on an output side of the inverter I2 is connected to the read bit line RBL through the N-type access transistor MN7 and on the other hand, another data holding node N12 on an input side of the inverter I2 is connected to the read bit line /RBL through the N-type access transistor MN8.

The read word line RWL is connected in common to respective gates of the access transistors MN7 and MN8.

The above is the circuit configuration of the 2-port SRAM cell S2.

Next, discussion will be made on configurations of the precharge circuit and the discharge circuit.

The precharge circuit consists of the P-type precharge transistors MP3 and MP4 and the fixed power supply VDD whose potential is V1. Specifically, one end of the read bit line RBL is connected to the fixed power supply VDD through the precharge transistor MP3 and on the other hand, one end of the read bit line /RBL is connected to the fixed power supply VDD through the precharge transistor MP4.

In this configuration, the precharge signal SP is inputted to the respective gates of the precharge transistors MP3 and MP4, which controls the precharge of the read bit lines RBL and /RBL.

On the other hand, the discharge circuit consists of the N-type discharge transistors MN5 and MN6 whose one ends are grounded. Specifically, one end of the write bit line WBL is grounded through the discharge transistor MN5 and on the other hand, one end of the write bit line /WBL is grounded through the discharge transistor MN6.

In this configuration, the discharge signal SD is inputted to the respective gates of the discharge transistors MN5 and MN6, which controls the discharge of the write bit lines WBL and /WBL.

The above is the circuit configurations of the precharge circuit and the discharge circuit.

Figure 7:
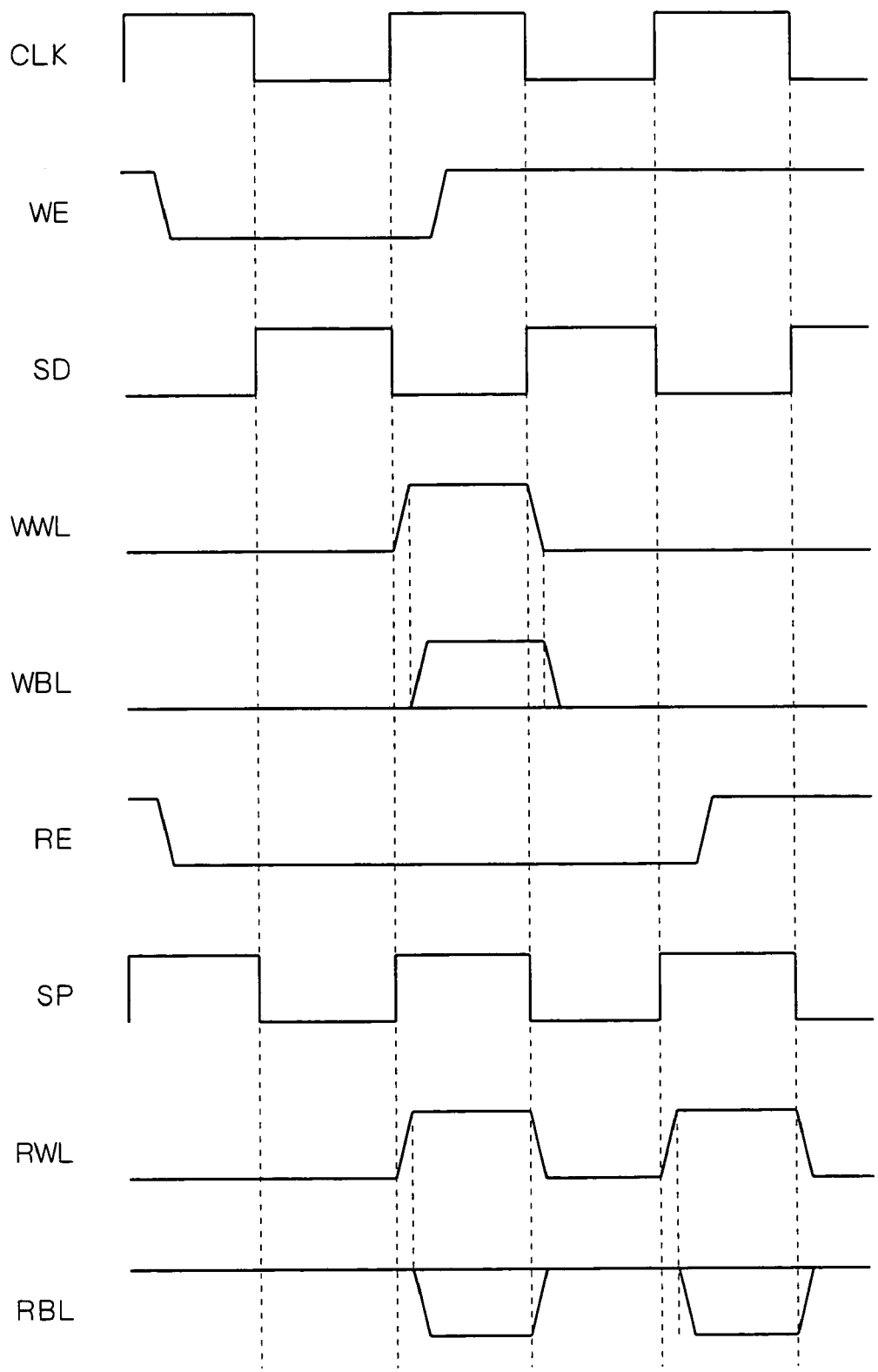
FIG. 7 is a timing chart showing an operation timing of the data storage circuit in accordance with the second preferred embodiment.

Next, specific discussion will be made on an operation of the data storage circuit in accordance with the second preferred embodiment shown in FIG. 6, referring to the timing chart of FIG. 7.

<Circuit Operation>

In the second preferred embodiment, the clock signal CLK is adopted as the precharge signal SP and an inverted signal of the clock signal CLK is adopted as the discharge signal SD.

During the period while the clock signal CLK indicates "0" level, since a signal of "0" level is inputted as the precharge signal SP, both the precharge transistors MP3 and MP4 come into the ON state and the read bit lines RBL and /RBL are precharged to have the potential V1.

On the other hand, during the period while the clock signal CLK indicates "0" level, since a signal of "1" level is inputted as the discharge signal SD, both the discharge transistors MN5 and MN6 come into the ON state and the write bit lines WBL and /WBL are discharged to have the ground potential.

Next, during the period while the clock signal CLK indicates "1" level, since the precharge signal SP comes into "1" level and the discharge signal SD comes into "0" level, the transistors MP3, MP4, MN5 and MN6 come into the OFF state and in the state where a write enable signal WE and/or a read enable signal RE indicate(s) "enable" ("0" level in FIG. 7), a normal operation of write/read of data is performed.

Therefore, the read bit lines RBL and /RBL are precharged to have the potential V1 before the reading operation of data from the SRAM cell S2 and the write bit lines WBL and /WBL are discharged to have the ground potential (the potential 1V) before the writing operation of data into the SRAM cell S2.

When the 2-port SRAM cell S2 is in the standby state, the write word line WWL and the read word line RWL are in "0" level.

The above is the operation of the data storage circuit of the second preferred embodiment.

In the data storage circuit of the second preferred embodiment, since the write bit lines WBL and /WBL are discharged in the standby state, it is possible to eliminate generation of leakage current in the access transistor MN9 or MN10. Therefore, reduction in standby power consumption of the data storage circuit can be achieved.

Further, since the precharge circuit and the discharge circuit are controlled on the basis of the clock signal CLK, it is possible to control the precharge of the read bit lines RBL and /RBL and the discharge of the write bit lines WBL and /WBL with a simple circuit design.

By providing the discharge circuit at the other end of the read bit lines RBL and /RBL and adopting the control of the precharge signal SP and the discharge signal SD discussed in the first preferred embodiment, it is possible to eliminate generation of leakage current in the access transistor MN7 or MN8 in the state of non-access to the memory cell in the operating mode. Therefore, further reduction in standby power consumption of the data storage circuit can be achieved.

While the control on the precharge circuit and the discharge circuit in the sleep mode has been discussed in the first preferred embodiment, the technique of the second preferred embodiment can be also applied to the control in the sleep mode.

Specifically, the precharge circuit and the discharge circuit are controlled on the basis of the mode signal MD which externally notifies whether to operate the 2-port SRAM cell S2 or make it sleep, and in the operating mode, control on precharge/discharge is performed on the basis of the chip enable signal CE (control may be made to perform precharge during the period while the clock signal indicates "0" level like in the background art) and in the sleep mode, the precharge circuit is turned OFF and the discharge circuit is kept ON.

This can also reduce the standby power consumption of the data storage circuit in the sleep mode.

Further, in the second preferred embodiment, since the write bit lines WBL and /WBL which are connected to the 2-port SRAM cell S2 are not precharged but discharged, a PMOS can be adopted as a writing driver.

Figure 8:
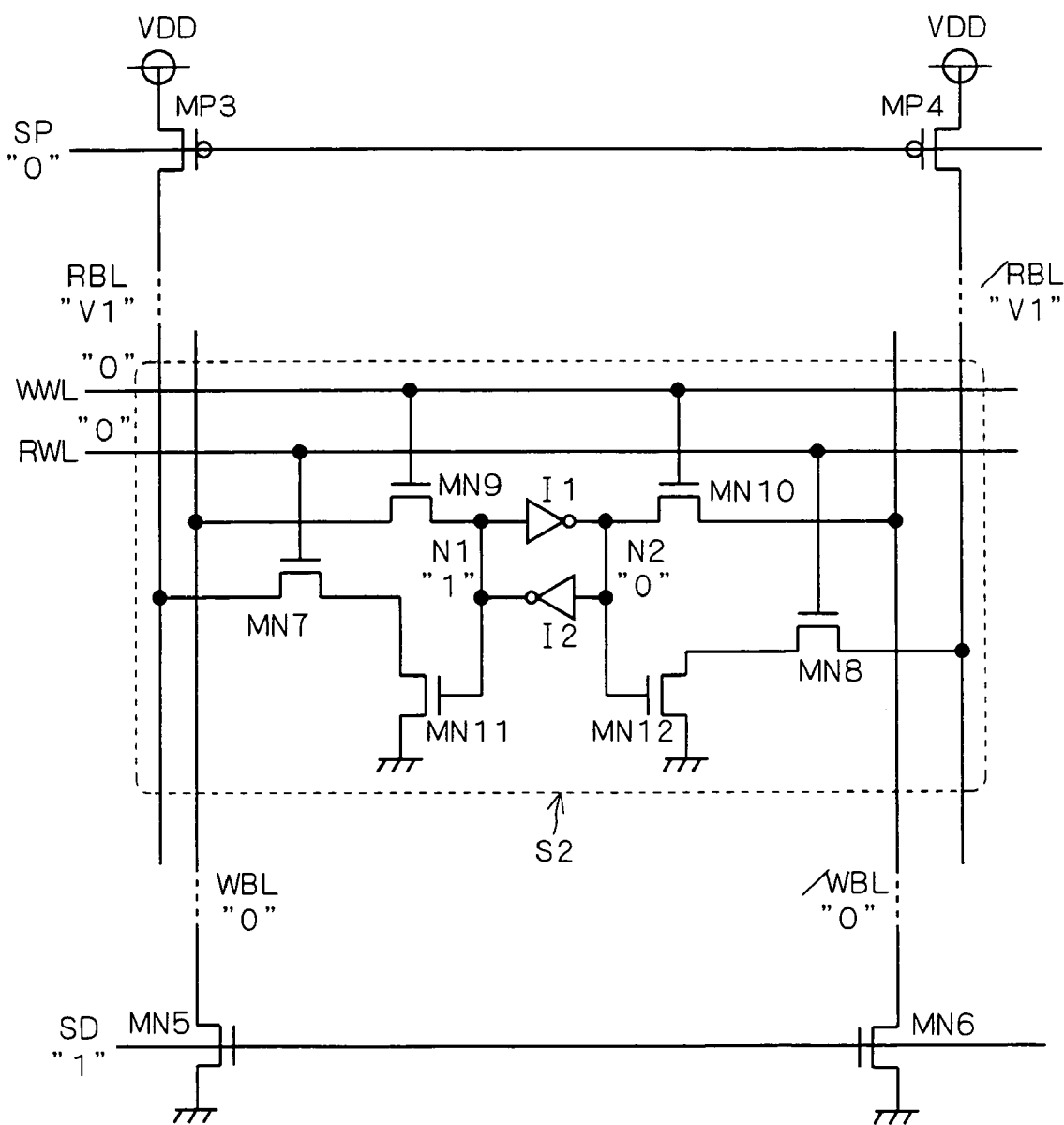
FIG. 8 is a circuit diagram showing another exemplary configuration of the data storage circuit in accordance with second preferred embodiment.

The second preferred embodiment can be also applied to a circuit configuration of the 2-port SRAM cell S2 in which drive transistors MN11 and MN12 for reading operation are additionally provided as shown in FIG. 8 and can produce the same effect as above.

While the 2-port SRAM cell S2 has been discussed in the second preferred embodiment, it goes without saying that the present preferred embodiment can be applied to a multiport SRAM having a lot of ports.

The Third Preferred Embodiment

FIG. 9 shows a configuration of a data storage circuit in accordance with the third preferred embodiment.

The data storage circuit of the third preferred embodiment comprises an SRAM cell S1 and a precharge circuit for precharging bit lines BL and /BL, and the precharge circuit is controlled to electrically disconnect the bit lines BL and /BL therefrom (bring the lines into a floating state) for a predetermined period on the basis of the mode signal MD having the operating mode and the sleep mode and the chip enable signal CE.

Though the data storage circuit comprises a plurality of SRAM cells S1 which are arranged in a matrix, a plurality of word lines WL used for selecting the respective SRAM cells S1 and a plurality of bit lines BL and /BL, FIG. 9 shows only one SRAM cell S1 and its relevant peripheral circuit in close-up.

Specific discussion will be made below on a configuration of the data storage circuit of the third preferred embodiment, referring to FIG. 9.

<Circuit Configuration>

Since the SRAM cell S1 has the same configuration as the SRAM cell S1 discussed in the first preferred embodiment, description thereof will be omitted.

Further, since the precharge circuit also has the same configuration as the precharge circuit discussed in the first preferred embodiment, description thereof will be omitted.

In this configuration, the precharge signal SP is inputted to the respective gates of the precharge transistors MP3 and MP4, which controls the precharge of the bit lines BL and /BL.

As is clear from the above configuration, the data storage circuit of the third preferred embodiment has the same configuration as the data storage circuit of the first preferred embodiment except that it has no discharge circuit.

Next, specific discussion will be made on an operation of the data storage circuit in accordance with the third preferred embodiment shown in FIG. 9, referring to the timing chart of FIG. 10. The data storage circuit of the third preferred embodiment has the operating mode and the sleep mode on the basis of the mode signal MD like that in the first preferred embodiment.

Figure 10:
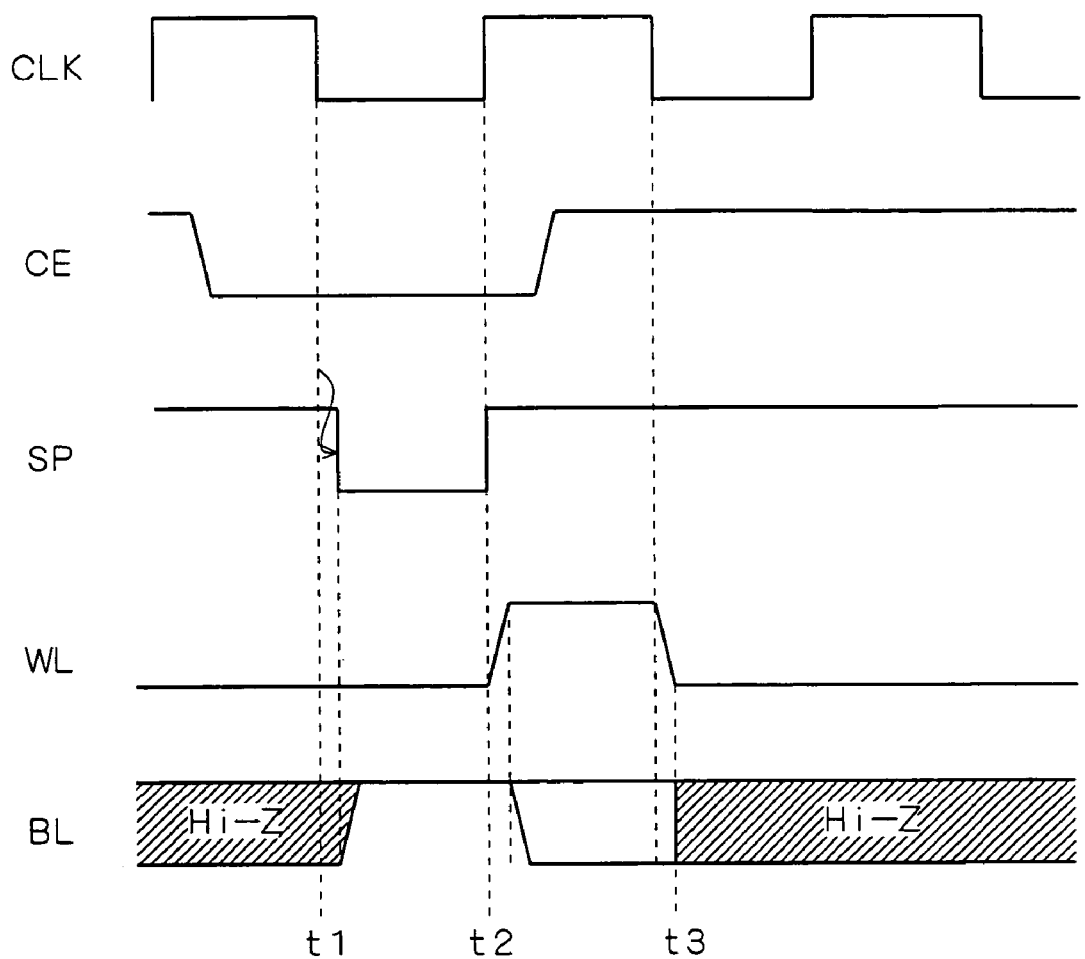
FIG. 10 is a timing chart showing a first operation timing of the data storage circuit in accordance with the third preferred embodiment.

FIG. 10 shows the timing chart only in the operating mode.

<Circuit Operation>

First, discussion will be made on a case where the data storage circuit is in the operating mode.

The precharge signal SP is controlled on the basis of the chip enable signal CE.

Specifically, when no access is made to the SRAM cell S1, in other words, when the chip enable signal CE indicates "disable" ("1" level in FIG. 10) (in the standby state), the precharge signal SP is controlled to come into "1" level.

Therefore, when the "1" level is inputted as the precharge signal SP, both the precharge transistors MP3 and MP4 come into the OFF state, and in the standby state of the data storage circuit, since the word line WL is fixed in "0" level, the bit lines BL and /BL are almost electrically independent and change into a floating state.

On the other hand, when the SRAM cell S1 is accessed, in other words, when the chip enable signal CE indicates "enable" ("0" level in FIG. 10), the precharge signal SP is controlled to come into the "0" level following the first fall of the clock signal CLK (i.e., the fall of the clock signal CLK at time t1 of FIG. 10) after the change of the chip enable signal CE into the "0" level for a predetermined period while the clock signal CLK is in the "0" level (a period until time t2 in FIG. 10).

When the "0" level is inputted as the precharge signal SP, with the above operation, both the precharge transistors MP3 and MP4 come into the ON state and the bit lines BL and /BL are precharged by the fixed power supply VDD to have the potential V1.

Next, after the precharge signal SP changes into "1" level in synchronization with the rise of the clock signal CLK at time t2 until the chip enable signal CE comes into "enable" again, the precharge signal SP is kept in the "1" level.

On the other hand, the predetermined word line WL is set to "1" level during a period from time t2 to time t3.

This brings the transistors MP3 and MP4 into the OFF state and a normal operation of write/read of data is performed at predetermined bit lines BL and /BL.

Therefore, in the operating mode of the data storage circuit of the third preferred embodiment, the bit lines BL and /BL are precharged to have the potential V1 for a predetermined period immediately before the write/read operation of data into/from the SRAM cell S1 and the bit lines BL and /BL are changed into a high-impedance state (Hi-Z) in the standby state of the SRAM cell S1.

Figure 11:
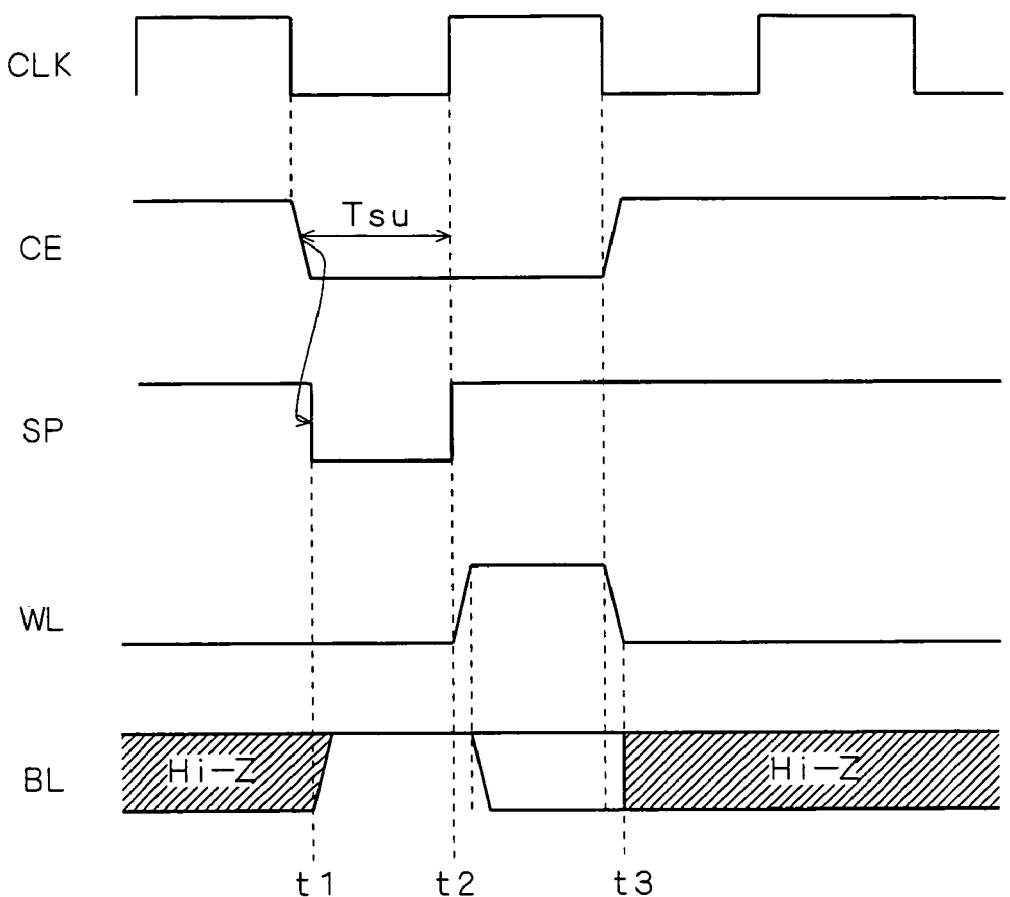
FIG. 11 is a timing chart showing a second operation timing of the data storage circuit in accordance with the third preferred embodiment.
Figure 12:
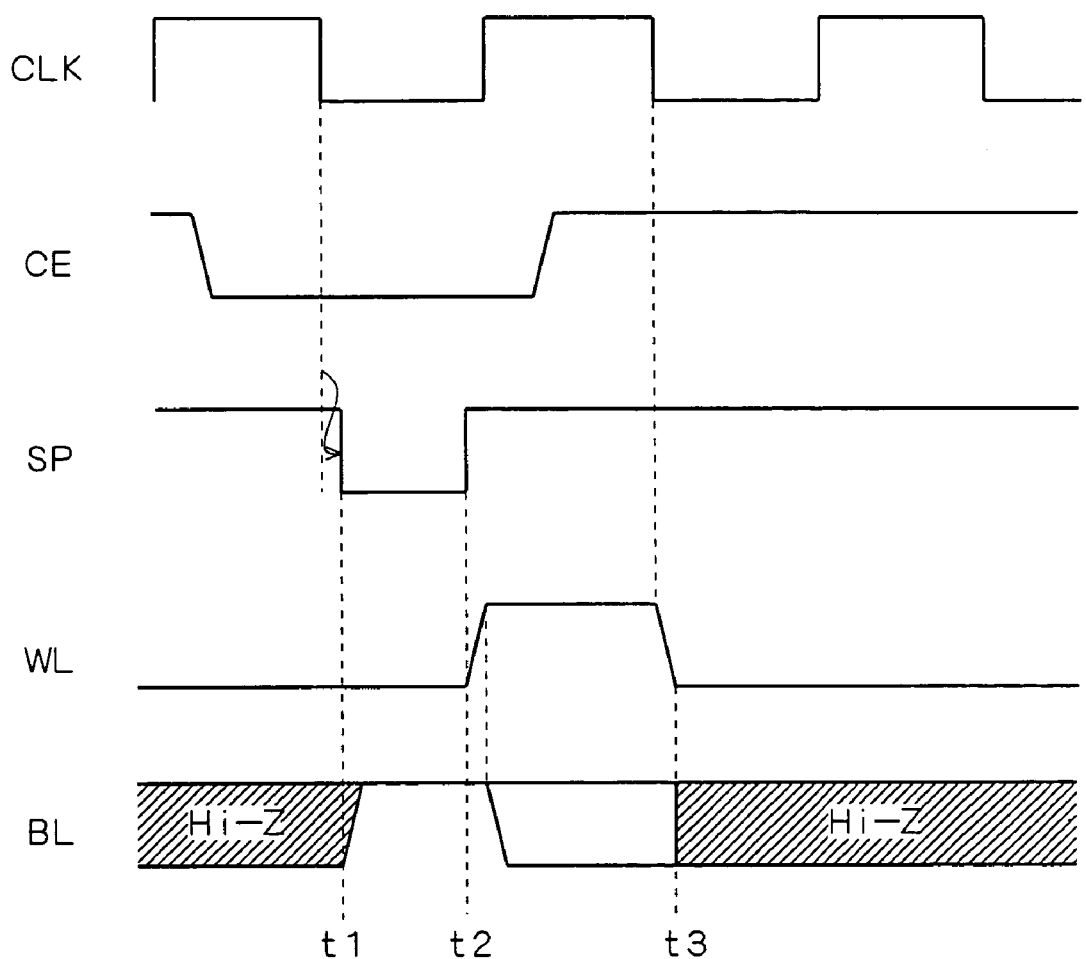
FIG. 12 is a timing chart showing a third operation timing of the data storage circuit in accordance with the third preferred embodiment.

While the operation of the data storage circuit of the third preferred embodiment on the basis of the timing chart of FIG. 10 has been discussed above, other control methods on the basis of the timing charts of FIGS. 11 and 12 may be performed.

Though the timing chart of FIG. 11 is almost the same as that of FIG. 10, these timing charts are different from each other in the timing of fall of the precharge signal SP into "0" level (in the timing chart of FIG. 11, it is assumed that an address signal and the chip enable signal CE are in synchronization with the fall of the clock signal CLK).

Specifically, when the SRAM cell S1 is accessed, in other words, when the chip enable signal CE indicates "enable" ("0" level in FIG. 11), the precharge signal SP is controlled to come into "0" level following the fall of the chip enable signal CE for a predetermined period while the clock signal CLK is in the "0" level (a period from time t1 to time t2 in FIG. 11).

When the "0" level is inputted as the precharge signal SP, with the above operation, both the precharge transistors MP3 and MP4 come into the ON state and the bit lines BL and /BL are precharged by the fixed power supply VDD to have the potential V1.

Next, after the precharge signal SP changes into "1" level in synchronization with the rise of the clock signal CLK at time t2 until the chip enable signal CE comes into "enable" again, the precharge signal SP is kept in the "1" level.

The above is the method of controlling the data storage circuit on the basis of the timing chart of FIG. 11, and by this method, like the method on the basis of the timing chart of FIG. 10, the bit lines BL and /BL can be also precharged only for a predetermined period (from the time of receiving the fall of the chip enable signal CE to the time of next rise of the clock signal CLK) before the write/read operation of data into/from the SRAM cell S1 in the operating mode and the bit lines BL and /BL come into the Hi-Z state after the write/read operation. Therefore, this method produces the same effect of reducing the standby power consumption as discussed above.

Since a period from the time of receiving fall of the chip enable signal CE to the rising edge of the clock signal CLK is a precharge period for the bit lines BL and /BL, it is necessary to add the time required for the precharge of the bit lines BL and /BL to a setup time tsu of the chip enable signal CE.

Next, the timing chart of FIG. 12 will be discussed.

Though the timing chart of FIG. 12 is almost the same as that of FIG. 10, these timing charts are different from each other in the timing of rise of the precharge signal SP from the "0" level.

Specifically, when the SRAM cell S1 is accessed, in other words, when the chip enable signal CE indicates "enable" ("0" level in FIG. 12), the precharge signal SP is controlled to come into the "0" level following the first fall of the clock signal CLK (i.e., the fall of the clock signal CLK at time t1 of FIG. 12) after the change of the chip enable signal CE into the "0" level for a predetermined period while the clock signal CLK is in the "0" level (a period until time t2 in FIG. 12).

In the timing chart of FIG. 12, the precharge signal SP rises before the rise of the clock signal CLK.

Next, after the precharge signal SP changes into "1" level at time t2 (before the rise of the clock signal CLK) until the chip enable signal CE comes into "enable" again, the precharge signal SP is kept in the "1" level.

On the other hand, the predetermined word line WL is set to "1" level during a period from time t2 to time t3 (the timing of setting the word line WL to the "1" level is different from that of FIG. 10).

The above is the method of controlling the data storage circuit on the basis of the timing chart of FIG. 12, and by this method, like the method on the basis of the timing chart of FIG. 10, the bit lines BL and /BL can be also precharged only for a predetermined period (from the time of receiving the fall of the clock signal CLK to the time of next rise of the clock signal CLK, i.e., a period from time t1 to time t2 in FIG. 12) before the write/read operation of data into/from the SRAM cell S1 in the operating mode and the bit lines BL and /BL come into the Hi-Z state after the write/read operation. Therefore, this method produces the same effect of reducing the standby power consumption as discussed above.

In this case, a pulse width of the "0" level of the precharge signal SP (i.e., the period from time t1 to time t2) depends on the time required for the precharge of the bit line BL and /BL.

Next, discussion will be made on a case where the data storage circuit is in the sleep mode.

In the sleep mode, it is assumed that both the precharge signal SP and the discharge signal SD are in "1" level. This brings both the transistors MP3 and MP4 into the OFF state.

Therefore, in the sleep mode of the data storage circuit, the bit lines BL and /BL are electrically disconnected and come into the Hi-Z state.

The above is the discussion on the operation of the data storage circuit of the third preferred embodiment.

Thus, in the data storage circuit of the third preferred embodiment where the bit lines BL and /BL come into the Hi-Z state in its standby state (in the sleep mode and in the state of non-access to the SRAM in the operating mode), when the leakage currents flow in the standby state and then a predetermined time period passes, the bit lines BL and /BL are settled down in a potential where the leakage currents Iga and Ioffa flowing in the precharge transistors MP3 and MP4 and the leakage currents Iga and ioffa flowing in the access transistors MN3 and MN4 are kept in balance, i.e., a potential lower than the potential VDD (in a state of equilibrium of the bit lines BL and /BL).

FIG. 13 shows the leakage currents Iga and Ioffa in the state of equilibrium of the bit lines BL and /BL. In this configuration, the data holding node N1 stores "1" level and the data holding node N2 stores "0" level.

The leakage currents Iga and Ioffa broadly depend on the potential difference between the terminals of the transistors and when the potential difference decreases, the leakage currents Iga and Ioffa also decrease. Herein, the leakage currents Iga and Ioffa indicated by the dotted line in FIG. 13 are leakage currents which are generated at portions whose potential difference is V1 or lower. Therefore, the leakage current indicated by the dotted line, which is caused by a potential difference lower than V1, is lower in current value than a leakage current indicated by the solid line, which is caused by the potential difference V1.

From the above consideration, it is understood that while four leakage currents are caused by the potential difference V1 in one SRAM cell S1 in the background art (see FIG. 4), the number of portions where leakage currents are generated increases by one (five leakage currents are generated in one SRAM cell S1) but the four leakage currents are caused by the potential difference lower than V1 except one leakage current in the third preferred embodiment.

Accordingly, the total amount of leakage currents in the standby state of the data storage circuit of the third preferred embodiment is smaller than that in the data storage circuit of the background art, and therefore it is possible to reduce the power consumption in the standby state as compared with that in background art.

The above is the discussion on the data storage circuit of the third preferred embodiment which allows reduction in standby power consumption by bringing the bit lines BL and /BL into the Hi-Z state in the standby state.

While the case of the SRAM cell S1 has been discussed above, the present preferred embodiment can be applied to the data storage circuit including the multiport SRAM cells. Specifically, it is possible to reduce the standby power consumption by bringing the write bit lines and/or the read bit lines into the Hi-Z state in the standby state.

In this case, a tristate buffer may be adopted for the write bit line as a write driver.

The Fourth Preferred Embodiment

Figure 14:
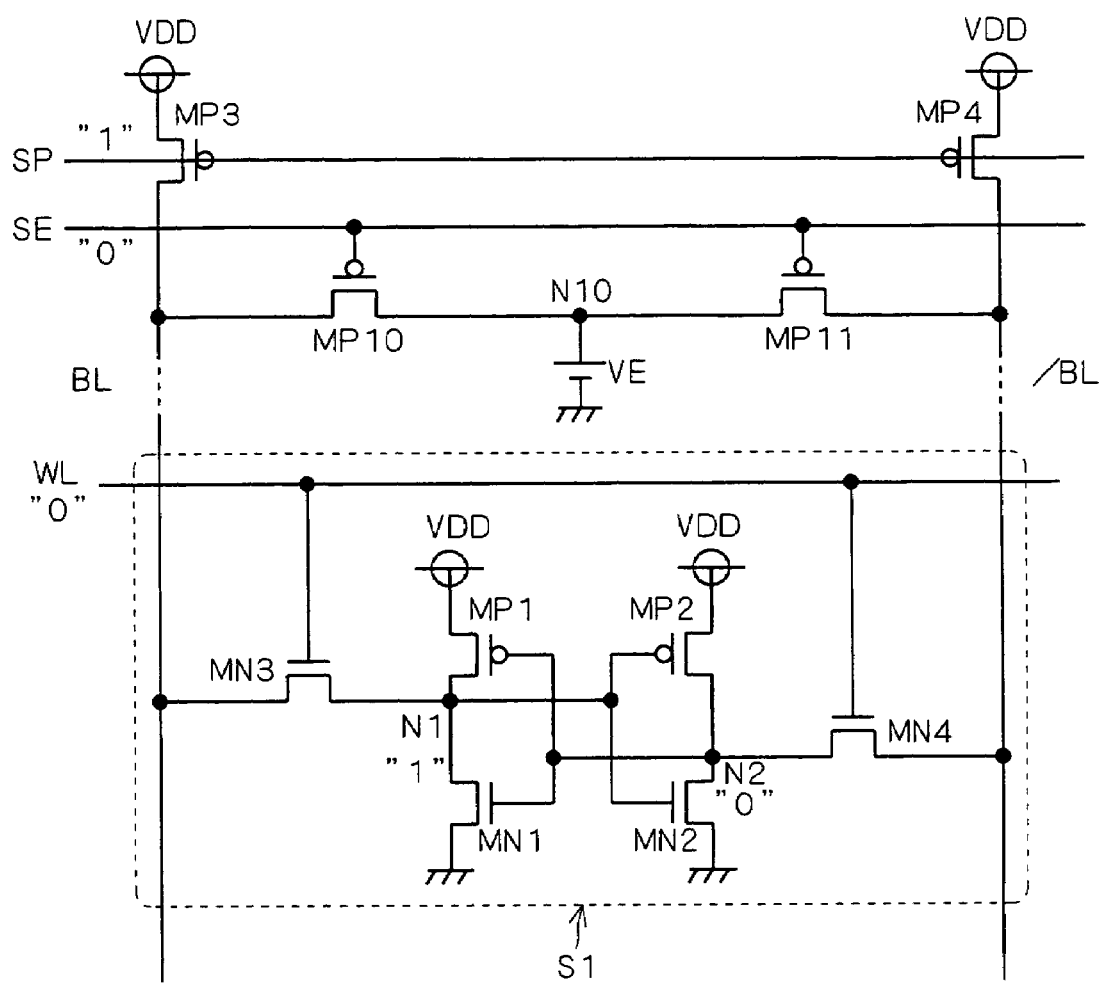
FIG. 14 is a circuit diagram showing a configuration of a data storage circuit in accordance with a fourth preferred embodiment.

FIG. 14 shows a configuration of a data storage circuit in accordance with the fourth preferred embodiment.

The data storage circuit of the fourth preferred embodiment comprises an SRAM cell S1, a precharge circuit for precharging bit lines BL and /BL and a potential setting circuit for setting the bit lines BL and /BL to a potential V2 which is lower than the precharge potential V1 (FIG. 14 shows an equalizer circuit and hereinafter the potential setting circuit will be discussed as an equalizer circuit), and the precharge circuit and the equalizer circuit are controlled on the basis of the mode signal MD having the operating mode and the sleep mode and the chip enable signal CE.

Though the data storage circuit comprises a plurality of SRAM cells S1 which are arranged in a matrix, a plurality of word lines WL used for selecting the respective SRAM cells S1 and a plurality of bit lines BL and /BL, FIG. 14 shows only one SRAM cell S1 and its relevant peripheral circuit in close-up.

Specific discussion will be made below on a configuration of the data storage circuit of the fourth preferred embodiment, referring to FIG. 14.

<Circuit Configuration>

Since the SRAM cell S1 has the same configuration as the SRAM cell S1 discussed in the first preferred embodiment, description thereof will be omitted.

Further, since the precharge circuit also has the same configuration as the precharge circuit discussed in the first preferred embodiment, description thereof will be omitted.

In this configuration, the precharge signal SP is inputted to the respective gates of the precharge transistors MP3 and MP4, which controls the precharge of the bit lines BL and /BL.

Next, the equalizer circuit comprises P-type equalizing transistors MP10 and MP11 and a voltage source VE for generating the potential V2 lower than the potential V1 of the fixed power supply VDD.

Specifically, one end of the equalizing transistor MP10 is connected to the bit line BL and the other end thereof is connected to one end of the equalizing transistor MP11. Further, the other end of the equalizing transistor MP11 is connected to the bit line /BL.

An equalizing signal SE is inputted in common to respective gates of the equalizing transistors MP10 and MP11.

A high potential side of the voltage source VE is connected to a node N10 disposed between the equalizing transistors MP10 and MP11 and a low potential side thereof is grounded.

The above is the configuration of the data storage circuit of the fourth preferred embodiment.

Next, specific discussion will be made on an operation of the data storage circuit in accordance with the fourth preferred embodiment shown in FIG. 14, referring to the timing chart of FIG. 15. The data storage circuit of the fourth preferred embodiment has the operating mode and the sleep mode on the basis of the mode signal MD like that in the first preferred embodiment.

Figure 15:
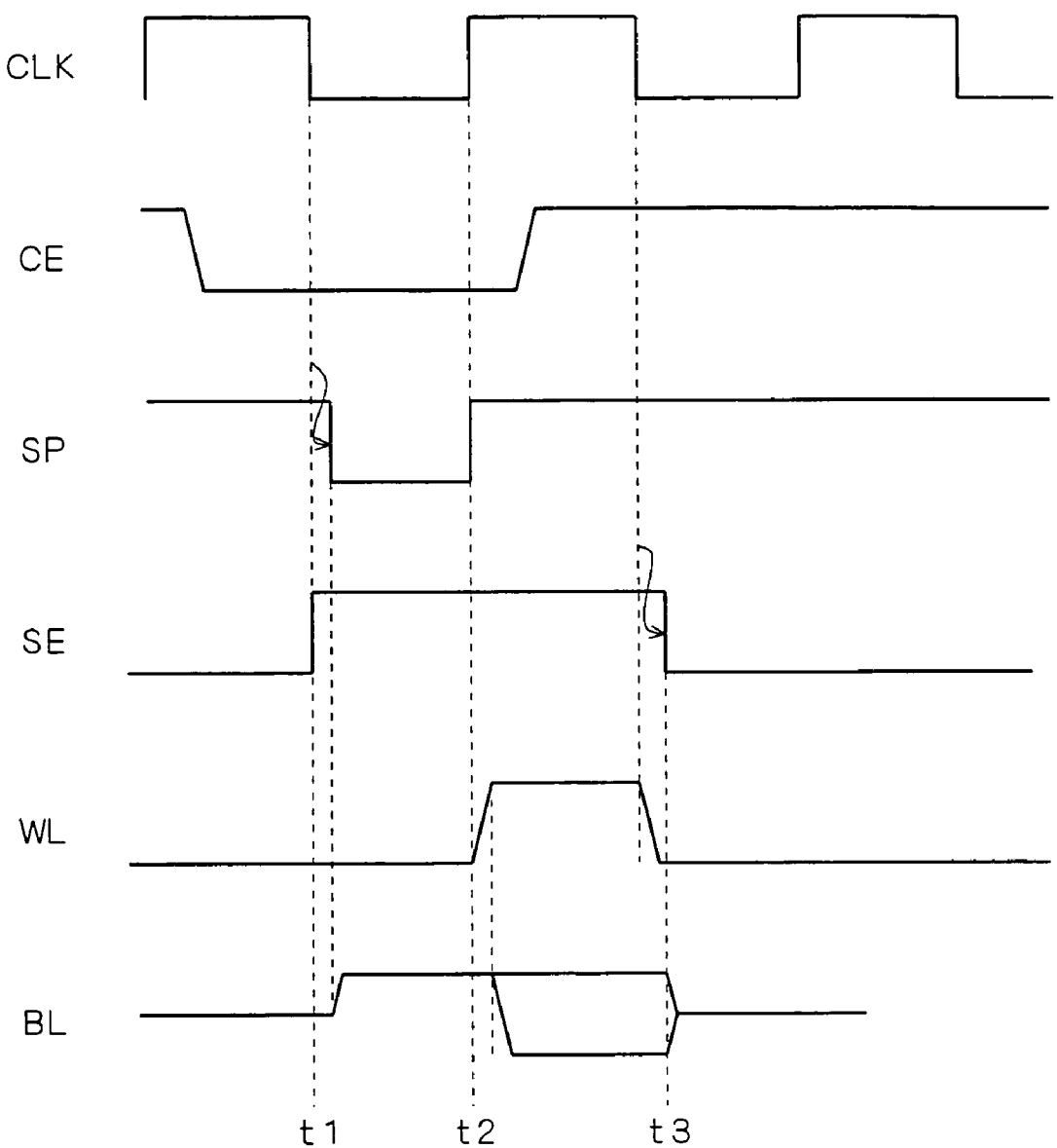
FIG. 15 is a timing chart showing an operation timing of the data storage circuit in accordance with the fourth preferred embodiment.

FIG. 15 shows the timing chart only in the operating mode.

<Circuit Operation>

First, discussion will be made on a case where the data storage circuit is in the operating mode.

The equalizing signal SE and the precharge signal SP are controlled on the basis of the chip enable signal CE.

Specifically, when no access is made to the SRAM cell S1, in other words, when the chip enable signal CE indicates "disable" ("1" level in FIG. 15) (in the standby state), the equalizing signal SE is controlled to come into "0" level following the first fall of the clock signal CLK (at time t3 of FIG. 15) after the change of the chip enable signal CE into the "1" level.

After that, as shown in FIG. 15, the equalizing signal SE may keep the "0" level during the period while the chip enable signal CE indicates the "1" level, and further the equalizing signal SE may be controlled to come into the "0" level only during a period while the clock signal CLK indicates "0" level while the chip enable signal CE indicates the "1" level, though not shown.

Therefore, when the "0" level is inputted as the equalizing signal SE, both the equalizing transistors MP10 and MP11 come into the ON state and the bit lines BL and /BL are set to the potential V2 by the voltage source VE. At this time, the precharge signal SP indicates "1" level, and the precharge transistors MP3 and MP4 are in the OFF state.

In the standby state of the data storage circuit, the word line WL is fixed to "0" level.

On the other hand, when the SRAM cell S1 is accessed, in other words, when the chip enable signal CE indicates "enable" ("0" level in FIG. 15), the precharge signal SP is controlled to come into "0" level following the first fall of the clock signal CLK (i.e., the fall of the clock signal CLK at time t1 of FIG. 15) after the change of the chip enable signal CE into the "0" level for a predetermined period while the clock signal CLK is in the "0" level (a period until time t2 in FIG. 15).

The equalizing signal SE is controlled to come into "1" level in synchronization with the first fall of the clock signal CLK (i.e., the fall of the clock signal CLK at time t1 of FIG. 15) after the change of the chip enable signal CE into the "0" level.

When the "0" level is inputted as the precharge signal SP, with the above operation, both the precharge transistors MP3 and MP4 come into the ON state and the bit lines BL and /BL are precharged by the fixed power supply VDD to have the potential V1. During a period while the "1" level is inputted as the equalizing signal SE, the equalizing transistors MP10 and MP11 are in the OFF state.

Next, when the precharge signal SP changes into "1" level in synchronization with the rise of the clock signal CLK at time t2, the precharge signal SP is controlled to keep in the "1" level and the equalizing signal SE is controlled to keep in the "1" level until time t3, and on the other hand, a predetermined word line WL is selected.

This brings the transistors MP3, MP4, MP10 and MP11 into the OFF state and a normal operation of write/read of data is performed at predetermined bit lines BL and /BL.

Therefore, in the operating mode of the data storage circuit of the fourth preferred embodiment, the bit lines BL and /BL are precharged to have the potential V1 for a predetermined period immediately before the write/read operation of data into/from the SRAM cell S1 and set to the potential V2 lower than the precharge potential V1 in the standby state of the SRAM cell S1.

Next, discussion will be made on a case where the data storage circuit is in the sleep mode.

In the sleep mode, it is assumed that the precharge signal SP is in "1" level and the equalizing signal SE is in "0" level. This brings the equalizing transistors MP10 and MP11 into the ON state and the precharge transistors MP3 and MP4 into the OFF state.

Therefore, in the sleep mode of the data storage circuit, the bit lines BL and /BL are equalized by the equalizer circuits to the potential V2 lower than the potential V1.

The above is the operation of the data storage circuit of the fourth preferred embodiment.

Thus, since the bit lines BL and /BL are set to the potential V2 lower than the precharge potential V1 in the standby state (in the sleep mode and in the state of non-access to the SRAM in the operating mode), the data storage circuit of the fourth preferred embodiment can produce the following effects.

Figure 16:
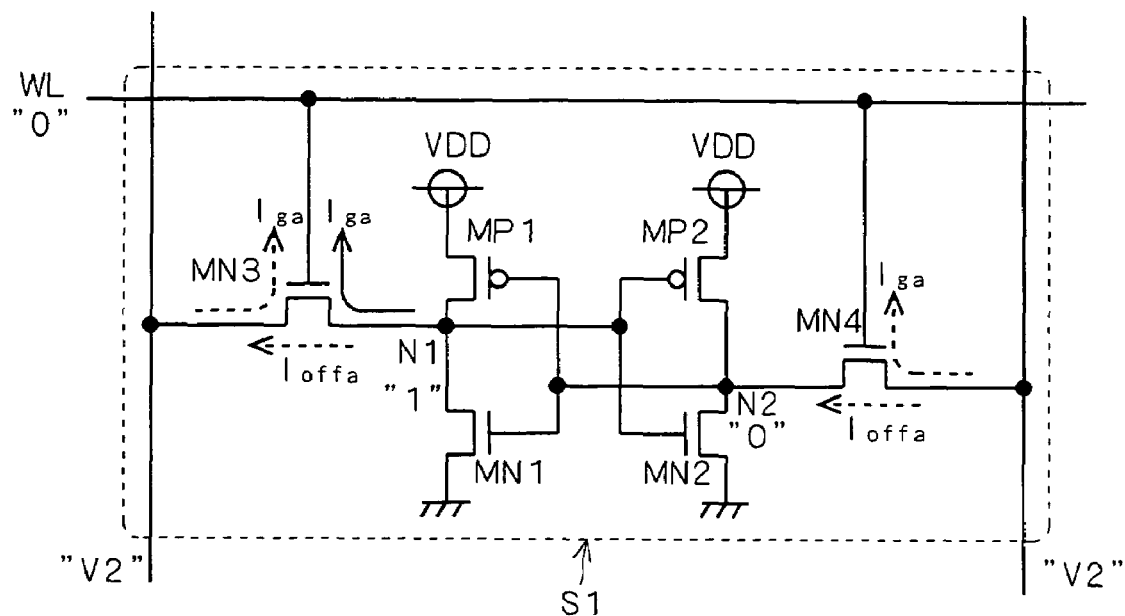
FIG. 16 is a circuit diagram showing leakage currents in a standby state of the data storage circuit in accordance with the fourth preferred embodiment.

FIG. 16 shows the leakage currents Iga and Ioffa flowing in the access transistors MN3 and MN4. In this configuration, the data holding node N1 stores "1" level and the data holding node N2 stores "0" level.

The leakage currents Iga and Ioffa broadly depend on the potential difference between the terminals of the transistors and when the potential difference decreases, the leakage currents Iga and Ioffa also decrease. Herein, the leakage currents Iga and Ioffa indicated by the dotted line in FIG. 16 are leakage currents which are generated at portions whose potential difference is V1 or lower. Therefore, the leakage current indicated by the dotted line, which is caused by the potential difference V2 lower than the potential difference V1, is lower in current value than a leakage current indicated by the solid line, which is caused by the potential difference V1.

It is understood that the above consideration is the same that in the third preferred embodiment. Accordingly, the total amount of leakage currents in the standby state of the data storage circuit of the fourth preferred embodiment is smaller than that in the data storage circuit of the background art (see FIG. 4), and therefore it is possible to reduce the standby power consumption.

The above is the discussion on the data storage circuit of the fourth preferred embodiment which allows reduction in standby power consumption by setting the bit lines BL and /BL to the potential V2 lower than the precharge potential V1 in the standby state.

While the case of the SRAM cell S1 has been discussed above, the present preferred embodiment can be applied to the data storage circuit including the multiport SRAM cells. Specifically, for example, it is possible to reduce the standby power consumption by setting the write bit lines and/or the read bit lines to the potential V2 lower than the precharge potential V1 with the equalizer circuit in the standby state.

In this case, a tristate buffer may be adopted for the write bit line as a write driver.

Further, when the bit lines BL and /BL are set to the potential V2 lower than the precharge potential V1 in the standby state, the potential of the bit line BL and that of the bit line /BL are individually set by independent circuits, without using the equalizer circuit, but by adopting the equalizer circuit, it is possible to equalize the bit lines BL and /BL in potential.

While the above discussion has been made on the case where the precharge signal SP and the equalizing signal SE are controlled on the basis of the mode signal MD and the chip enable signal CE, it goes without saying that these signals can be controlled on the basis of the clock signal CLK, like in the second preferred embodiment.

The Fifth Preferred Embodiment

A data storage circuit of the fifth preferred embodiment is a circuit including a plurality of memory cell blocks each of which is formed of a plurality of memory cells, and in each of the memory cell blocks, the bit lines of the memory cells belonging to the memory cell block are discharged, brought into the Hi-Z state or set to a lower voltage on the basis of the mode signal and the address signal.

Figure 17:
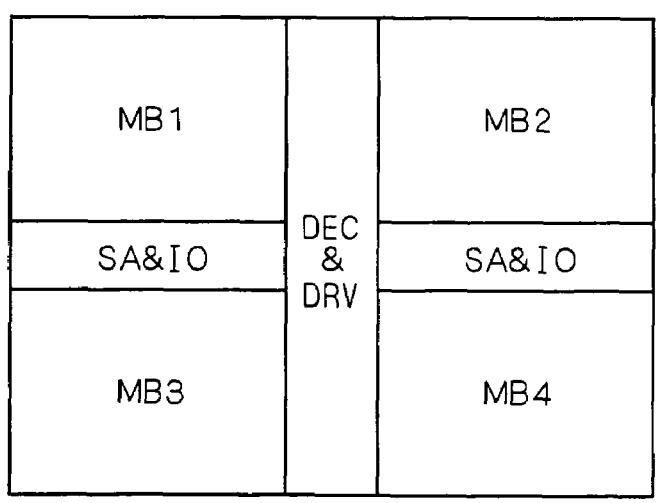
FIG. 17 is a block diagram showing a constitution of a data storage circuit in accordance with a fifth preferred embodiment.

FIG. 17 schematically shows a data storage circuit in accordance with the fifth preferred embodiment.

The data storage circuit of the fifth preferred embodiment comprises four memory cell blocks MB1 to MB4 each of which is formed of a plurality of memory cells (e.g., SRAMs or CAMs), a DEC & DRV circuit constituted of an address decoder and a word line driver and an SA & IO circuit constituted of a sense amplifier and a data input portion.

In the operating mode of the data storage circuit having the above constitution, when an address signal for accessing a predetermined memory cell is sent out, a word line rises, which is associated with an address specified by the address signal.

In a case where the four memory cell blocks MB1 to MB4 are separated in an address space, such as the data storage circuit of FIG. 17, when a predetermined address signal is sent out, only one of the four memory cell blocks MB1 to MB4 which is specified by the address signal operates.

For example, if there are four memory cell blocks, such as the memory cell blocks MB1 to MB4, one of the memory cell blocks MB1 to MB4 is specified by 2 bits in the high-order position of the address signal, and then word lines corresponding to the specified memory cell block rise and the specified memory cell block performs an operation.

On the other hand, the other three memory cell blocks which are not specified by the 2 bits in the high-order position of the address signal do not perform operations, and on the basis of the address signal, bit lines in the memory cells belonging to the three memory cell blocks are discharged, brought into the Hi-Z state or set to a lower voltage.

Specifically, the discharge circuit having the configuration discussed in the first preferred embodiment is connected to each bit line, and ON/OFF of the discharge circuit is controlled on the basis of the address signal. Also in the case where the bit lines are brought into the Hi-Z state or set to a lower voltage, with the circuit configuration of the above-discussed preferred embodiments, by controlling the equalizer circuit or the precharge circuit on the basis of the address signal, the bit lines of the memory cells belonging to the three memory cell blocks which are not specified by the address signal can be brought into the Hi-Z state or set to a lower voltage.

In the sleep mode, the bit lines connected to the memory cells belonging to all the memory cell blocks MB1 to MB4 are discharged, brought into the Hi-Z state or set to a lower voltage.

Thus, since the data storage circuit of the fifth preferred embodiment in the operating mode is controlled on the basis of the address signal to allow the memory cell block specified by the address signal to perform a normal operation and the other memory cell blocks which are not specified to discharge the bit lines or the like, the data storage circuit can reduce the leakage currents in the standby state of the memory cell blocks which are not specified by the address signal.

Further, since all the memory cell blocks MB1 to MB4 are controlled to discharge the bit lines or the like in the sleep mode, it is possible to reduce the leakage currents in the standby state of all the memory cell blocks MB1 to MB4 in the sleep mode.

Therefore, it is possible to perform control on the discharge of the bit lines or the like which is more exacting than the control on the basis of the chip enable signal CE, and further reduce the power consumption of the data storage circuit.

Furthermore, there may be a case where the above technique is applied to SRAMs or CAMs of bit-line dividing system in which not only word lines but also bit lines are selected by using the address signal and not-selected bit lines are discharged, brought into the Hi-Z state or set to a lower voltage. This also reduces the leakage currents.

While the above discussion of the fifth preferred embodiment has been made on the SRAMs or CAMs whose mode can be set by the mode signal MD, it goes without saying that this preferred embodiment can be additionally applied to SRAMs or CAMs which do not set the mode by the mode signal MD.

<The Sixth Preferred Embodiment>

Figure 18:
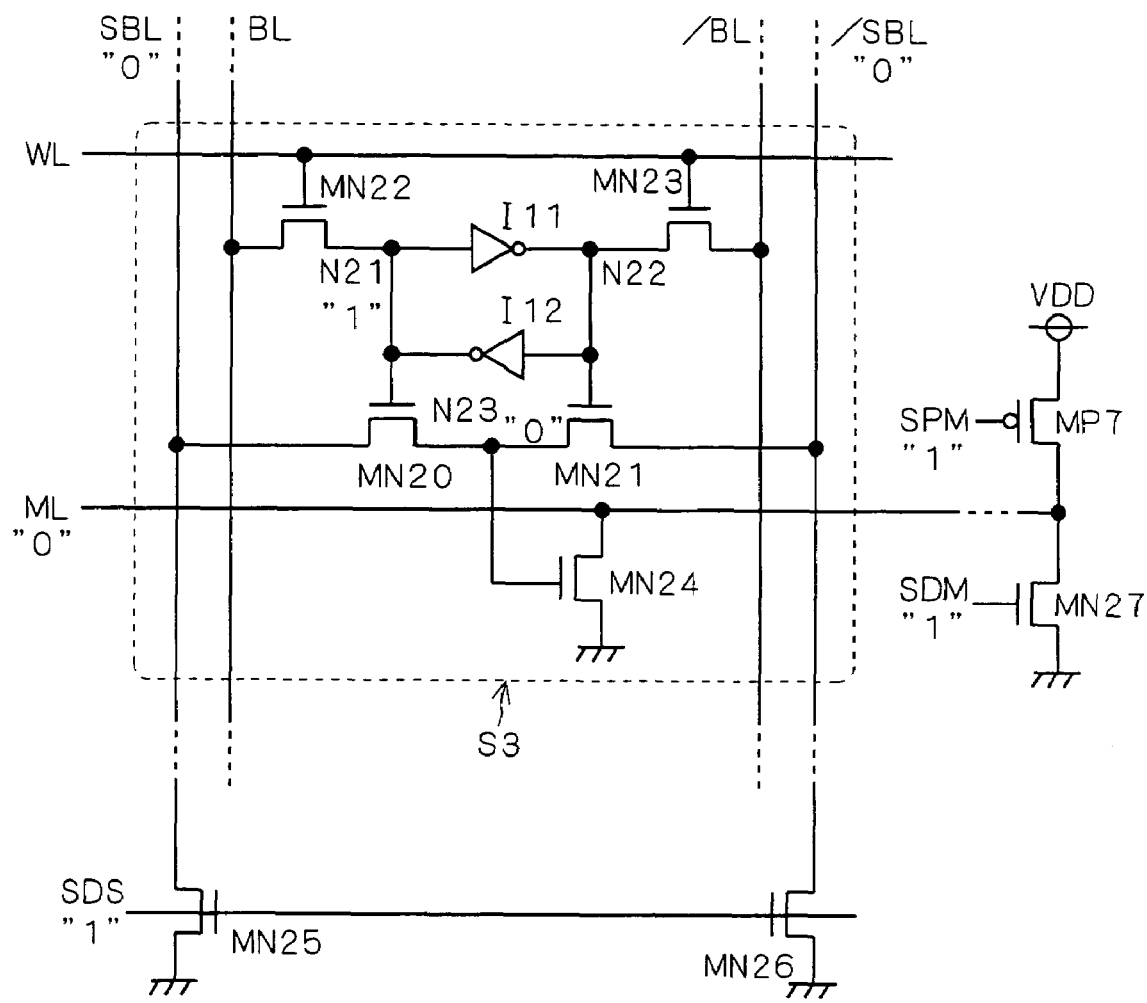
FIG. 18 is a circuit diagram showing a configuration of a data storage circuit in accordance with a sixth preferred embodiment.

FIG. 18 shows a configuration of a data storage circuit in accordance with the sixth preferred embodiment.

The data storage circuit of the sixth preferred embodiment comprises a static content addressable memory (CAM) cell S3, a precharge circuit for precharging a match line ML and a discharge circuit for discharging the match line ML, and the precharge circuit and the discharge circuit are controlled on the basis of the mode signal MD having the operating mode and the sleep mode and the searching signal SS.

Though the data storage circuit comprises a plurality of CAM cells S3 which are arranged in a matrix, a plurality of word lines WL used for selecting the respective CAM cells S3, a plurality of write/read (W/R) bit lines BL and /BL and a plurality of search bit lines SBL and /SBL, FIG. 18 shows only one CAM cell S3 and its relevant peripheral circuit in close-up.

Specific discussion will be made below on a configuration of the data storage circuit of the sixth preferred embodiment, referring to FIG. 18.

<Circuit Configuration>

First, the CAM cell S3 consists of two inverters I11 and I12 whose input portions and output portions are connected to each other, four N-type access transistors MN20 to MN23 and an N-type pull-down transistor MN24.

Specifically, a data holding node N21 on an input side of the inverter I11 is connected to the W/R bit line BL through the N-type access transistor MN22 and on the other hand, a data holding node N22 on an output side of the inverter I11 is connected to the W/R bit line /BL through the N-type access transistor MN23.

The word line WL is connected in common to respective gates of the access transistors MN22 and MN23.

Further, the data holding node N21 is connected to a gate of the N-type access transistor MN20 and the data holding node N22 is connected to a gate of the N-type access transistor MN21.

In this configuration, one end of the access transistor MN20 is connected to the search bit line SBL and the other end thereof is connected to one end of the access transistor MN21. The other end of the access transistor MN21 is connected to the search bit line /SBL.

A node N23 disposed between the access transistors MN20 and MN21 is connected to a gate of the pull-down transistor MN24. A source of the pull-down transistor MN24 is grounded and a drain thereof is connected to the match line ML.

The above is the circuit configuration of the CAM cell S3.

Next, discussion will be made on configurations of the precharge circuit and the discharge circuit.

The precharge circuit consists of a P-type precharge transistor MP7 and the fixed power supply VDD whose potential is V1. Specifically, the match line ML is connected to the fixed power supply VDD through the precharge transistor MP7.

In this configuration, a precharge signal SPM is inputted to a gate of the precharge transistor MP7, which controls precharge of the match line ML.

On the other hand, the discharge circuit consists of N-type discharge transistors MN25 to MN27 which are grounded. Specifically, one end of the search bit line SBL is grounded through the discharge transistor MN25, one end of the search bit line /SBL is grounded through the discharge transistor MN26 and the match line ML is grounded through the discharge transistor MN27.

In this configuration, a discharge signals SDS is inputted to respective gates of the discharge transistors MN25 and MN26 and a discharge signal SDM is inputted to a gate of the discharge transistor MN27, and the discharge signals SDS and SDM control discharge of the search bit lines SBL and /SBL and the match line ML.

The above is the circuit configurations of the precharge circuit and the discharge circuit.

Next, specific discussion will be made on an operation of the data storage circuit in accordance with the sixth preferred embodiment shown in FIG. 18, referring to the timing chart of FIG. 19. The data storage circuit of the sixth preferred embodiment has the operating mode and the sleep mode on the basis of the mode signal MD like that in the first preferred embodiment.

FIG. 18 shows the timing chart only in the operating mode.

<Circuit Operation>

First, discussion will be made on a case where the data storage circuit is in the operating mode.

The discharge signals SDS and SDM and the precharge signal SPM are controlled on the basis of the searching signal SS.

Specifically, when no matching operation is performed in the CAM cell S3, in other words, when the searching signal SS indicates "disable" ("1" level in FIG. 19) (in the standby state), the discharge signals SDM and SDS are controlled to come into "1" level following the first fall of the clock signal CLK (at time t13 of FIG. 19) after the change of the searching signal SS into the "1" level.

Figure 19:
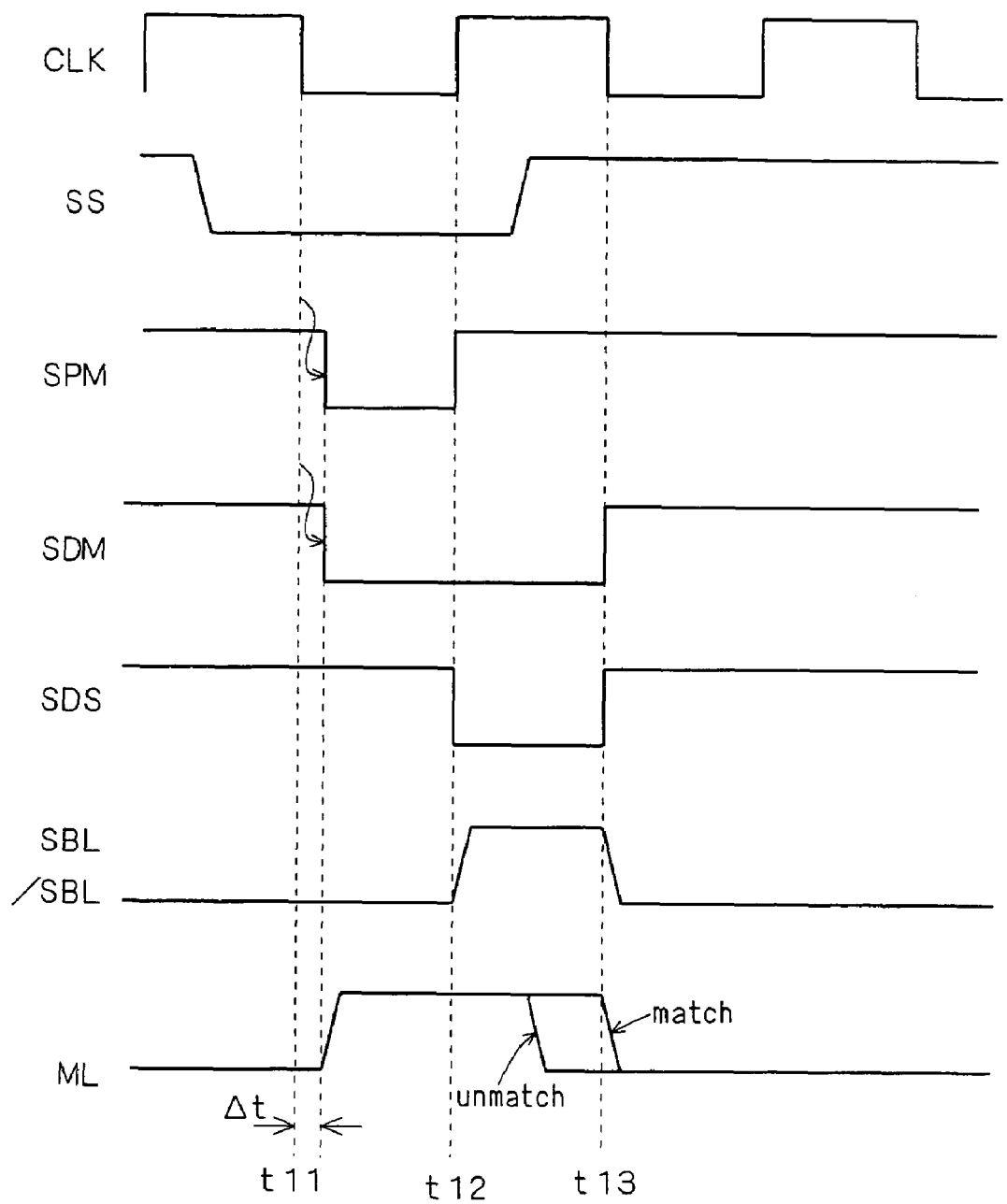
FIG. 19 is a timing chart showing an operation timing of the data storage circuit in accordance with the sixth preferred embodiment.

After that, as shown in FIG. 19, the discharge signals SDM and SDS may keep the "1" level during the period while the searching signal SS indicates the "1" level, and further the discharge signals SDM and SDS may be controlled to come into the "1" level only during a period while the clock signal CLK indicates "0" level while the searching signal SS indicates the "1" level, though not shown.

Therefore, when the "1" level is inputted as the discharge signals SDM and SDS, all the discharge transistors MN25 to MN27 come into the ON state and the search bit lines SBL and /SBL and the match line ML are discharged to have the ground potential.

In the standby state of the data storage circuit (where the searching signal SS indicates "disable"), the word line WL is fixed to "0" level. Further, when the searching signal SS indicates "disable", write/read of data is performed into/from the CAM cell S3 through the W/R bit lines BL and /BL.

On the other hand, when the matching operation is performed in the CAM cell S3, in other words, when the searching signal SS indicates "enable" ("0" level in FIG. 19), the precharge signal SPM is controlled to come into "0" level following the first fall of the clock signal CLK (i.e., the fall of the clock signal CLK at time t11 of FIG. 19) after the change of the searching signal SS into the "0" level for a predetermined period while the clock signal CLK is in the "0" level (a period until time t12 in FIG. 19).

The discharge signal SDM is controlled to come into "0" level following the first fall of the clock signal CLK (i.e., the fall of the clock signal CLK at time t11 of FIG. 19) after the change of the searching signal SS into the "0" level.

When the "0" level is inputted as the precharge signal SPM, with the above operation, the precharge transistor MP7 comes into the ON state and the match line ML is precharged by the fixed power supply VDD to have the potential V1. During a period while the "0" level is inputted as the discharge signal SDM, the discharge transistor MN27 is in the OFF state. The above is a precharge operation for the match line ML before the actual matching operation.

Next, when the precharge signal SPM changes into "1" level in synchronization with the rise of the clock signal CLK at time t12, the precharge signal SPM is controlled to keep in the "1" level and the discharge signal SDM is controlled to keep in the "0" level until time t13, and on the other hand, the precharge signal SDS changes into "0" level during a period from time t12 to time t13.

This brings the transistors MP7, MN25, MN26 and MN27 into the OFF state and the searching signal SS is sent to predetermined search bit lines SBL and /SBL for a predetermined period. In other words, the signal of "1" level is sent to either one of the search bit lines SBL and /SBL.

In a state where no searching operation is performed, both the search bit lines SBL and /SBL are discharged into "0" level. In other words, in this state, the node N23 is in "0" level and the pull-down transistor MN24 is in the OFF state.

Therefore, in the operating mode of the data storage circuit of the sixth preferred embodiment, the match line ML is precharged to have the potential V1 for a predetermined period immediately before the matching operation in the CAM cell S3 and the match line ML is discharged to have the ground potential (0V) in the standby state of the CAM cell S3.

Then, during a predetermined period after time t12, with the potential change of the match line ML using ON/OFF of the pull-down transistor MN24, a matching result, i.e., "matched" or "unmatched", is outputted to the match line ML.

Next, discussion will be made on a case where the data storage circuit is in the sleep mode.

In the sleep mode of the data storage circuit, all the precharge signal SPM and the discharge signals SDM and SDS are brought into "1" level. This brings the discharge transistors MN25 to MN27 into the ON state and the precharge transistor MP7 into the OFF state.

Therefore, in the sleep mode of the data storage circuit, the search bit lines SBL and /SBL and the match line ML are discharged by the discharge circuit, to have the ground potential.

The above is discussion on the operation of the data storage circuit of the sixth preferred embodiment.

Figure 20:
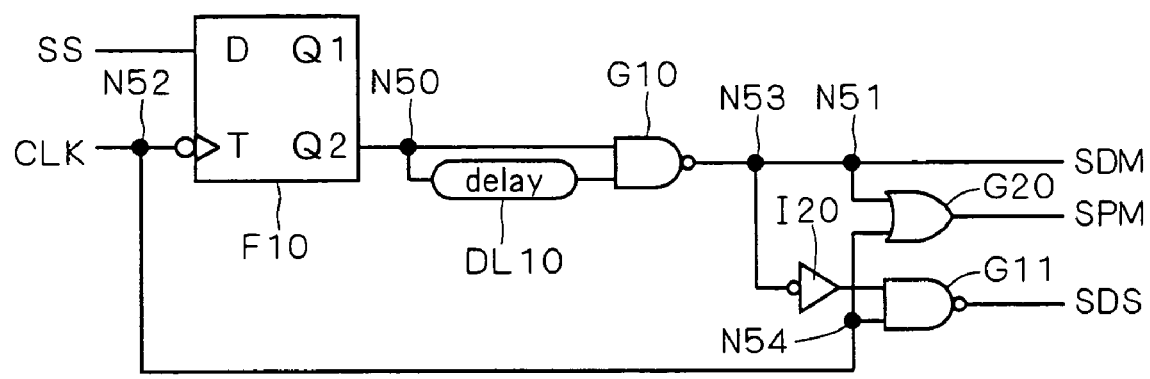
FIG. 20 is a circuit diagram showing a configuration of a signal generation circuit in accordance with the sixth preferred embodiment.

In order to generate the precharge signal SPM and the discharge signals SDM and SDS in accordance with the timing chart of FIG. 19, a signal generation circuit such as shown in FIG. 20 is needed.

As can be seen from the signal generation circuit of FIG. 20, the precharge signal SPM and the discharge signals SDM and SDS are generated on the basis of the searching signal SS and the clock signal CLK. Configuration and operation of the signal generation circuit will be discussed below.

<Configuration of Signal Generation Circuit>

As can be seen from FIG. 20, the signal generation circuit consists of a flip-flop circuit F10, a delay circuit DL10, two NAND gates G10 and G11, an OR gate G20 and an inverter I20. The delay circuit DL10 is a circuit having a delay time of Δt.

The searching signal SS is inputted to a D terminal of the flip-flop circuit F10 and an inverted clock signal CLK is inputted to a T terminal of the flip-flop circuit F10.

Further, a Q2 terminal of the flip-flop circuit F10 (from the Q2 terminal outputted is an inverted signal of an output from the Q1 terminal, i.e., an inverted signal of the searching signal SS captured to the D terminal in synchronization with the clock signal CLK) is connected to one input portion of the NAND gate G10 through a node N50 and on the other hand to an input portion of the delay circuit DL10. An output portion of the delay circuit DL10 is connected to the other input portion of the NAND gate G10. An output portion of the NAND gate G10 outputs the discharge signal SDM.

An output portion of the NAND gate G10 is branched at a node N51 and connected to one input portion of the OR gate G20 and the clock signal CLK which is branched at a node N52 is inputted to the other input portion of the OR gate G20. The OR gate G20 outputs the precharge signal SPM.

An output portion of the NAND gate G10 is branched at a node N53 and connected to one input portion of the NAND gate G11 through the inverter I20 and the clock signal CLK which is branched at nodes N52 and N54 is inputted to the other input portion of the NAND gate G11. The NAND gate G11 outputs the discharge signal SDS.

<Operation of Signal Generation Circuit>

Next, discussion will be made on an operation of the signal generation circuit which has the configuration shown in FIG. 20, referring to the timing chart of FIG. 19. It is assumed herein that the flip-flop circuit F10 captures the searching signal SS at the timing of fall of the clock signal CLK. Further, it is assumed that the delay time of the delay circuit DL10 is ? t and there is no other delay time of the other circuits.

The flip-flop circuit F10 captures the searching signal SS of "0" level from the D terminal in synchronization with the fall of the clock signal CLK at time t11, holds the signal of "0" level until the next fall of the clock signal CLK is inputted and outputs a signal of "1" level from the Q2 terminal.

Further, the flip-flop circuit F10 captures the searching signal SS of "1" level from the D terminal in synchronization with the fall of the clock signal CLK at time t13, holds the signal of "1" level until the next fall of the clock signal CLK is inputted and outputs a signal of "0" level from the Q2 terminal.

The data storage circuit of the sixth preferred embodiment performs the searching operation during a period while the searching signal SS indicates "0" level and does not perform the searching operation and comes into the standby state during a period while the searching signal SS indicates "1" level.

Therefore, referring to the clock signal CLK and the searching signal SS shown in FIG. 19, the Q2 terminal of the flip-flop circuit F10 outputs the signal of "1" level during the period from time t11 to time t13 and outputs the signal of "0" level after time t13.

Further, since the delay circuit DL10 has the delay time of Δt, the output portion of the delay circuit DL10 outputs the signal of "1" level during a period from time t11+Δt to time t13+Δt and outputs the signal of "0" level after the time t13+?t.

Therefore, by the signal generation circuit of FIG. 20, the discharge signal SDM outputted from the output portion of the NAND gate G10 is brought into "0" level during the period from time t11+Δt to time t13 and into "1" level after time t13, as shown in FIG. 19.

The precharge signal SPM which is an OR output of the discharge signal SDM and the clock signal CLK is brought into "0" level during the period from time t11+Δt to time t12 and into "1" level after time t12.

Further, the discharge signal SDS which is a NAND output of an inverted signal of the discharge signal SDM and the clock signal CLK is brought into "0" level during the period from time t12 to time t13 and into "1" level after time t13.

The above is the description of the signal generation circuit.

Thus, in the data storage circuit of the sixth preferred embodiment (in other words, the precharge/discharge circuit for the match line ML which is controlled on the basis of the mode signal MD and the searching signal SS), since the match line ML is discharged by the discharge transistor MN27 in a state where no matching operation is performed, the following effects can be produced.

Specifically, in the state where no matching operation is performed, the search bit lines SBL and /SBL are discharged in "0" level and data of "0" or "1" is stored in the data holding node N21 or N22 (in FIG. 18, data of "1" is stored in the data holding node N21).

Therefore, the access transistor MN20 or MN21 comes into the ON state (in FIG. 18, the access transistor MN20 comes into the ON state), and the node N23 comes into "0" level and the pull-down transistor MN24 comes into the OFF state.

In such a state, when the match line ML is precharged by the precharge transistor MP7, like in the background-art CAM cell, a subthreshold current and a gate leak current flow in the pull-down transistor MN24 and the standby power consumption thereby increases.

Then, like in the sixth preferred embodiment, the discharge transistor MN27 is additionally provided and in the state where no matching operation is performed (i.e., in the operating mode without the matching operation and in the sleep mode), the precharge transistor MP7 and the discharge transistor MN27 are controlled to discharge the match line ML at a predetermined timing with the precharge signal SPM and the discharge signal SDM on the basis of the mode signal MD and the searching signal SS.

With the above operation, since the match line ML is brought into "0" level in the state where no matching operation is performed, neither subthreshold current nor gate leak current is generated in the pull-down transistor MN24 and the power consumption in this state can be reduced.

While the above discussion has been made on the case where the match line ML is discharged in the state where no matching operation is performed, if the present preferred embodiment is applied to the case where the match line ML is brought into the Hi-Z state or set to a lower voltage, the same effect can be produced.

Further, while the case of CAM whose mode can be set by the mode signal MD has been discussed in the present preferred embodiment, it goes without saying that this preferred embodiment can be additionally applied to CAMs which do not set the mode by the mode signal MD.

While the invention has been shown and described in detail, the foregoing description is in all aspects illustrative and not restrictive. It is therefore understood that numerous modifications and variations can be devised without departing from the scope of the invention.

What is claimed is:

1. A data storage circuit having an operating mode and a sleep mode on the basis of a mode signal, comprising:
    a plurality of memory cells for storing data;
    a plurality of bit lines for transmitting the data;
    a precharge circuit for precharging said bit lines with a first potential; and
    a potential setting circuit for setting said bit lines to a second potential which is lower than said first potential,
    wherein said precharge circuit precharges said bit lines to have said first potential before write or read of data into/from said memory cells when a chip enable signal indicates "enable" in said operating mode and wherein said potential setting circuit sets said bit lines to said second potential in said operating mode with said chip enable signal indicating "disable" and in the sleep mode.

2. The data storage circuit according to claim 1, wherein said bit lines include read bit lines and write bit lines, said precharge circuit precharges said read bit lines, and said potential setting circuit sets said read bit lines and said write bit lines to said second potential.

3. The data storage circuit according to claim 1, wherein said potential setting circuit includes a discharge circuit for discharging said bit lines to a ground potential.

4. The data storage circuit according to claim 1, wherein at least one pair of bit lines are connected to each of said memory cells, and
said potential setting circuit includes an equalizer circuit for equalizing potentials of said pair of bit lines.

5. The data storage circuit according to claim 1, wherein said precharge circuit precharges said bit lines during a predetermined period while a clock signal indicates "0" level in said operating mode with said chip enable signal indicating "enable".

6. A data storage circuit comprising:
    a plurality of content addressable memory cells in which matching of stored data is performed with a searching signal;
    a plurality of match lines to which a result of said matching is outputted;
    a precharge circuit for precharging said match lines with a first potential; and
    a potential setting circuit for setting said match lines to a second potential which is lower than said first potential,
    wherein said precharge circuit precharges said match lines with said first potential before said matching of data stored in said content addressable memory cells when said searching signal indicates "enable" and wherein said potential setting circuit sets said match lines to said second potential when said searching signal indicates "disable", namely, during the write/read operation.

7. The data storage circuit according to claim 6, wherein said potential setting circuit includes a discharge circuit for discharging said match lines to a ground potential.

* * * * *